(12) United States Patent
Imada et al.

(10) Patent No.: US 7,539,610 B2
(45) Date of Patent: May 26, 2009

(54) MICROCOMPUTER LOGIC DEVELOPMENT

(75) Inventors: Shougo Imada, Kobe (JP); Toshihiro Kashihara, Kobe (JP); Takashi Higuchi, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 491 days.

(21) Appl. No.: 10/769,488

(22) Filed: Jan. 29, 2004

(65) Prior Publication Data
US 2004/0186938 A1    Sep. 23, 2004

(30) Foreign Application Priority Data
Jan. 31, 2003   (JP)   ............................ 2003-024733

(51) Int. Cl.
G06F 9/455    (2006.01)
G06F 9/44     (2006.01)
G06F 13/10    (2006.01)
G06F 13/12    (2006.01)
G06F 19/00    (2006.01)

(52) U.S. Cl. .................. 703/28; 703/24; 703/21; 701/29; 701/35; 701/102

(58) Field of Classification Search .................. 703/21, 703/24, 28; 701/29, 35, 102
See application file for complete search history.

(56) References Cited

U.S. PATENT DOCUMENTS 5,838,948 A    11/1998   Bunza
5,864,712 A *  1/1999   Carmichael et al. ........... 710/20
5,908,455 A *  6/1999   Parvahan ..................... 701/29

(Continued)

FOREIGN PATENT DOCUMENTS
EP    1 202 193 A2    5/2002

(Continued)

OTHER PUBLICATIONS

Milan Vasilko, David Long "RIFLE-62: a flexible environment for prototyping dynamically reconfigurable systems" ISBN: 0-8186-8479-8, Rapid System Prototyping, 1998, Proceedings. 1998 Ninth International Workshop on, Jun. 3-5, 1998, pp. 130-135.*

(Continued)

*Primary Examiner*—Paul L Rodriguez
*Assistant Examiner*—Dwin McTaggart Craig
(74) *Attorney, Agent, or Firm*—Christie, Parker & Hale, LLP

(57) ABSTRACT

Provided is a logic development system that can ensure the capability of a CPU required for preceding logic, guarantee reliable communication of input/output information, and improve the throughput of the CPU. A logic development system for a built-in microcomputer employed in an electronic control unit (ECU) comprises: a motherboard that accommodates an application facility and a communication facility; a core board that accommodates quasi microcomputer peripheral devices, a, computing facility, and a communication facility and that is connected to the motherboard over a PCI bus; and an interface board that includes circuits equivalent to the hardware of the ECU and that is connected to the core board. The communication facility on the motherboard and each of the quasi microcomputer peripheral devices on the core board transfer data directly to or from each other over the PCI bus linking them.

23 Claims, 25 Drawing Sheets

U.S. PATENT DOCUMENTS

| | | | | |
|---|---|---|---|---|
| 5,935,223 | A | * | 8/1999 | Griffith et al. ................. 710/38 |
| 5,943,490 | A | * | 8/1999 | Sample ........................ 703/28 |
| 6,356,823 | B1 | * | 3/2002 | Iannotti et al. ............... 701/35 |

FOREIGN PATENT DOCUMENTS

| | | |
|---|---|---|
| JP | 62-190542 | 8/1987 |
| JP | 63-211197 | 9/1988 |
| JP | 2-85934 | 3/1990 |
| JP | 7-129428 | 5/1995 |
| JP | 8-16425 | 1/1996 |
| JP | 9-16408 | 1/1997 |
| JP | 9-288593 | 11/1997 |
| JP | 2000-122890 | 4/2000 |
| JP | 2000-298596 | 10/2000 |
| JP | 2003-167756 | 6/2003 |
| WO | WO 00/57273 | 9/2000 |

OTHER PUBLICATIONS

Patent Abstracts of Japan for Publication No. 2003-167756, Publication Date Jun. 13, 2003, in the name of Higuchi Takashi et al.

Patent Abstract of Japan, Publication 62190542 A, Published Aug. 20, 1987, in the name of Shinohara.

Patent Abstract of Japan, Publication 02085934 A, Published Mar. 27, 1990, in the name of Watanabe, et al.

Patent Abstract of Japan, Publication 07-129428, Published May 19, 1995, in the name of Suzuki.

Patent Abstract of Japan, Publication 08-016425, Published Jan. 19, 1996, in the name of Nakajima, et al.

Patent Abstract of Japan, Publication 09-288593, Published Nov. 19, 1997, in the name of Nagatome.

Patent Abstract of Japan, Publication 2000-122890, Published Apr. 28, 2000, in the name of Masuda.

"Mechanism for delivering a plug and play resource from a BIOS to an OS", WinPC Labs, Nikkei WinPC, (Sep. 2002), pp. 146 to 147.

Patent Abstracts of Japan, Publication No. 63-211197, dated Feb. 9, 1988, in the name of Kazuo Kazuuji et al.

Patent Abstracts of Japan, Publication No. 09-016408, dated Jan. 17, 1997, in the name of Tomohito Koyano.

Patent Abstracts of Japan, Publication No. 2000-298596, dated Oct. 24, 2000, in the name of Chong Min Kyung et al.

Japan Office action dated Feb. 5, 2008, for priority Japan Application 2003-024733, with English translation indicating relevance of references listed in an IDS filed on Apr. 4, 2008.

English translation of part of p. 146 for reference: "Mechanism for delivering a plug and play resource from a BIOS to an OS", WinPC Labs, Nikkei WinPC, (Sep. 2002), pp. 146 to 147, previously filed Apr. 4, 2008.

* cited by examiner

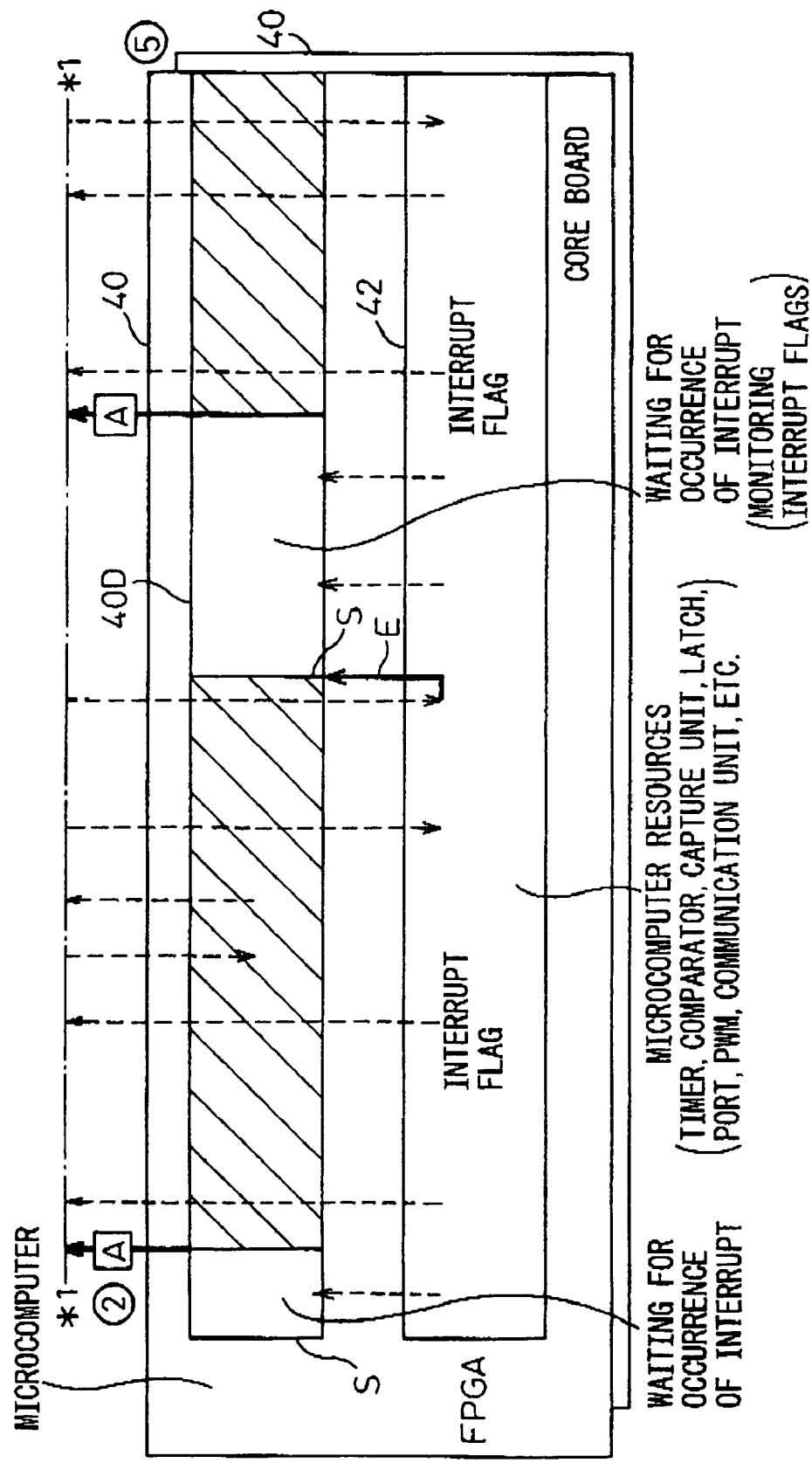

Fig.10A

| | MOTHERBOARD | CORE BOARD | FACILITY BOARD |
|---|---|---|---|
| 1 | AN ENGINEER TURNS ON THE POWER SUPPLY OF THE SYSTEM. | DITTO | THE POWER SUPPLY IS OFF |
| 2 | SOFTWARE IS DOWNLOADED FROM THE HOST COMPUTER, AND THE MOTHERBOARD IS ACTIVATED. | DITTO PCI INTERRUPTS ARE LOCKED. | |
| 3 | INITIAL VALUES TO WHICH PORTS ARE SET ARE DETERMINED. (※1)<br>(1) THE COMPARATOR IS SET TO AN IMMEDIATE OUTPUT MODE.<br>(2) THE PWM IS SET TO A 0% OUTPUT MODE.<br>(3) THE SIGNAL INIT1 IS DRIVEN LOW.<br>(4) THE MAIN ROUTINE IS SET TO STATE 1. | | |
| 4 | ACTION OF STATE 1<br>(1) A WAIT STATE IS MAINTAINED UNTIL THE SWITCH IGSW IS TURNED ON. | | |
| 5 | (2) WHETHER THE SWITCH IGSW IS TURNED ON IS DETECTED.<br>(3) THE MAIN ROUTINE IS SET TO STATE 2. | | THE POWER SUPPLY IS TURNED ON. |

Fig.10B

| | | POWER-ON RESET TIME (POWER IC) |
|---|---|---|
| 6 | ACTION OF STATE 2<br>(1) THE CONTENTS OF A MEMORY ARE RESTORED<br>(WHEN THE BATTERY IS REMOVED,<br>DATA IS INITIALIZED)<br>(2) DATA IN AN EEPROM IS RESTORED.<br>(3) THE MAIN ROUTINE IS SET TO STATE 3. | |
| 7 | ACTION OF STATE 3<br>(1) A WAIT STATE FOR WAITING UNTIL A POWER<br>-ON RESET TIME ELAPSES IS MAINTAINED. | |
| 8 | (2) THE POWER-ON RESET TIME ELAPSES. | THE SIGNAL INIT2 IS DRIVEN HIGH. |
| 9 | (3) THE SIGNAL INIT1 IS DRIVEN HIGH.<br>(4) FACILITIES OTHER THAN THE COMMUNICATION FACILITY ARE INITIALIZED.<br>(5) THE MAIN ROUTINE IS SET TO STATE 4. | THE SIGNAL INIT1 IS DRIVEN HIGH. BOTH THE SIGNALS INIT1 AND INIT2 ARE HIGH. THE RESET STATE IS CANCELED. |
| 10 | ACTION OF STATE 4<br>(1) A WAIT STATE IS MAINTAINED UNTIL THE INITIALIZATION TIME REQUIRED FOR THE FACILITY BOARD ELAPSES. | INITIALIZATION |
| 11 | (2) THE INITIALIZATION TIME REQUIRED FOR THE FACILITY BOARD ELAPSES.<br>(3) COMMUNICATION OF INITIALIZATION DATA ― DMA COMMUNICATION → THE MAIN PROCESS IS DOWNLOADED.<br>TO THE FACILITY BOARD IS STARTED.<br>(4) THE MAIN ROUTINE IS SET TO STATE 5. | |
| 12 | | |

Fig.11A

| | MOTHERBOARD | CORE BOARD | FACILITY BOARD |
|---|---|---|---|
| 12 | ACTION OF STATE 5<br>(1) A WAIT STATE IS MAINTAINED UNTIL COMMUNICATION OF INITIALIZATION DATA TO THE FACILITY BOARD IS COMPLETED. | | DATA IS RECEIVED. AND TRANSMISSION DATA IS PRODUCED. |
| 13 | (2) SENSING COMPLETION →<br>※IF A TIMEOUT OCCURS WITHOUT COMPLETION, THE MAIN ROUTINE IS RETURNED TO STATE 4. | | ← THE TRANSMISSION DATA IS TRANSMITTED. |
| 14 | ACTION OF STATE 6<br>(1) INITIALIZATION IS COMPLETED. | | |
| 15 | (2) A REQUEST FOR UNLOCKING PCI INTERRUPTS → IS ISSUED TO THE CORE BOARD.<br>(3) THE MAIN ROUTINE IS SET TO STATE 7. | ALL THE INTERRUPT FLAGS ARE CLEARED. PCI INTERRUPTS ARE UNLOCKED. | |

Fig.11B

| | | PCI INTERRUPT HANDLING | COMMUNICATION OF A PCI INTERRUPT REQUEST IS STARTED. | THE POWER SUPPLY IS TURNED OFF. |
|---|---|---|---|---|
| 16 | ACTION OF STATE 7<br>(1) A WAIT STATE IS MAINTAINED UNTIL THE SWITCH IGSW IS TURNED OFF. | | | |
| 17 | (2) IT IS DETECTED WHETHER THE SWITCH IGSW IS TURNED OFF.<br>(3) THE MAIN ROUTINE IS SET TO STATE 8. | | | |
| 18 | ACTION OF STATE 8<br>(1) A REQUEST FOR LOCKING PCI INTERRUPTS IS ISSUED. | PCI INTERRUPTS ARE LOCKED. | | |
| 19 | (2) THE DATA IN THE MEMORY AND EEPROM IS PRESERVED. | | PCI INTERRUPTS ARE DISABLED. | |
| 20 | (3) THE PORTS ARE SET TO INITIAL VALUES. SAME AS (※1)<br>(AFTER INITIALIZATION IS COMPLETED, THE MAIN ROUTINE IS SET TO STATE 1.) | | | |

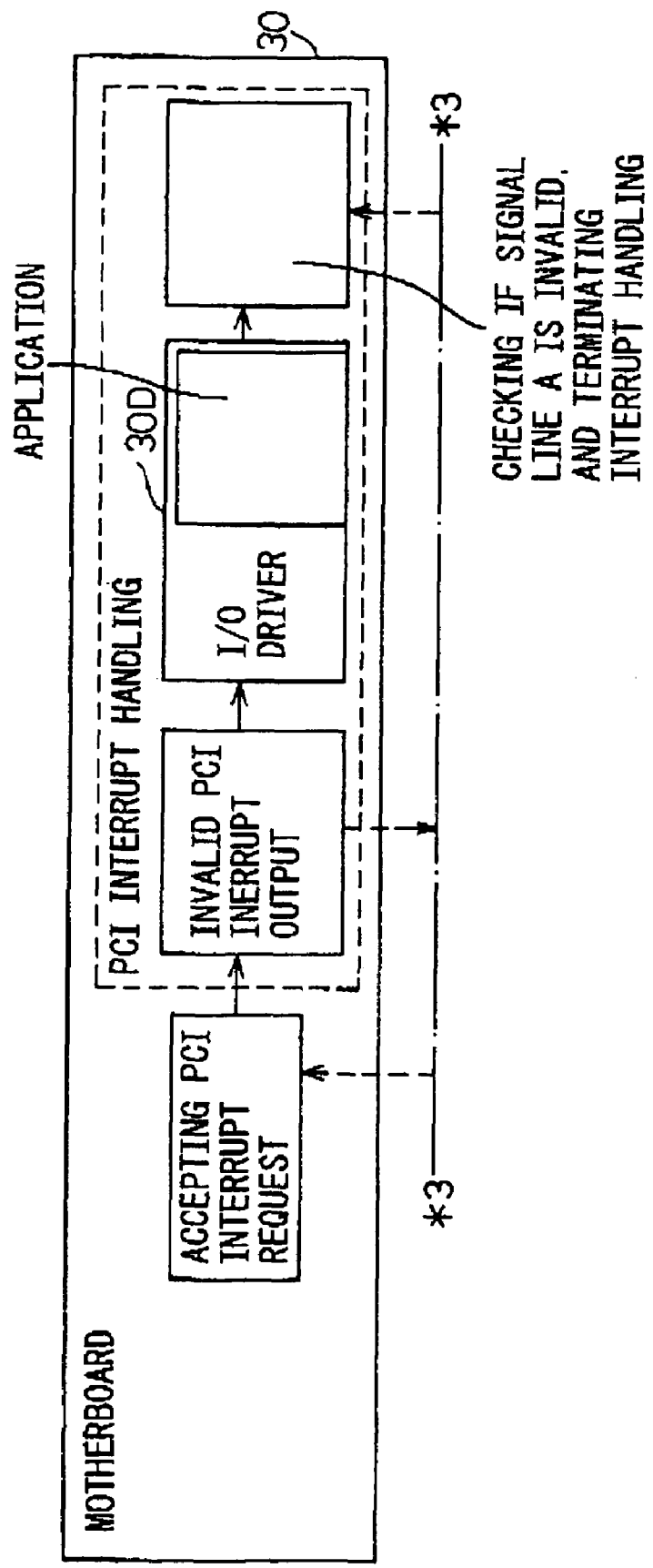

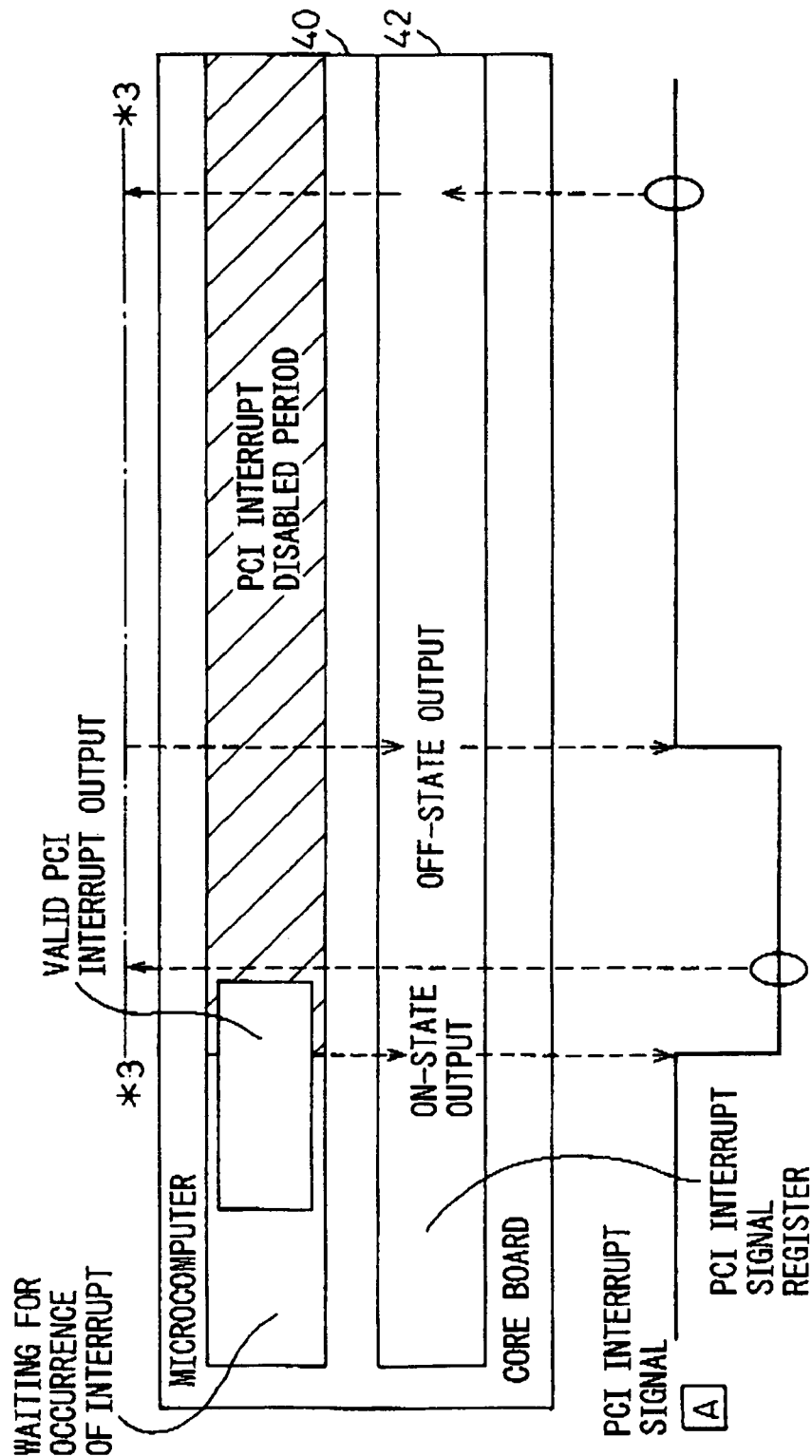

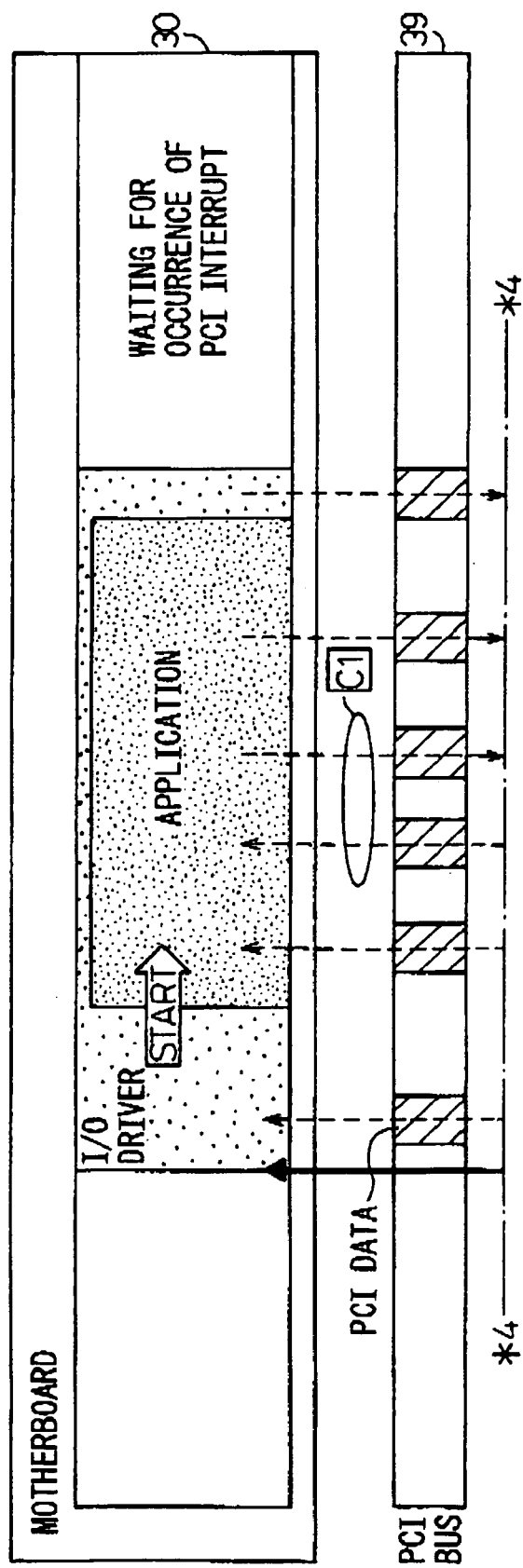

| ················ | CH5 | CH4 | CH3 | CH2 | CH1 | CH0 |
|---|---|---|---|---|---|---|
| ················ | 0 | 0 | 1 | 0 | 0 | 1 |

READ 1 AS PRESENCE OF AN INTERRUPT FACTOR,
AND READ 0 AS ABSENCE OF AN INTERRUPT FACTOR.
WRITE 1 TO CLEAR DATA, AND WRITE 0 TO PRESERVE DATA.

(b)

| CAPTURED VALUE ON CHANNEL CH0 | |
|---|---|
| CAPTURED VALUE ON CHANNEL CH1 | |
| CAPTURED VALUE ON CHANNEL CH2 | |
| CAPTURED VALUE ON CHANNEL CH3 | |
| CAPTURED VALUE ON CHANNEL CH4 | |
| CAPTURED VALUE ON CHANNEL CH5 | |

|← 32 BITS IN WIDTH →|

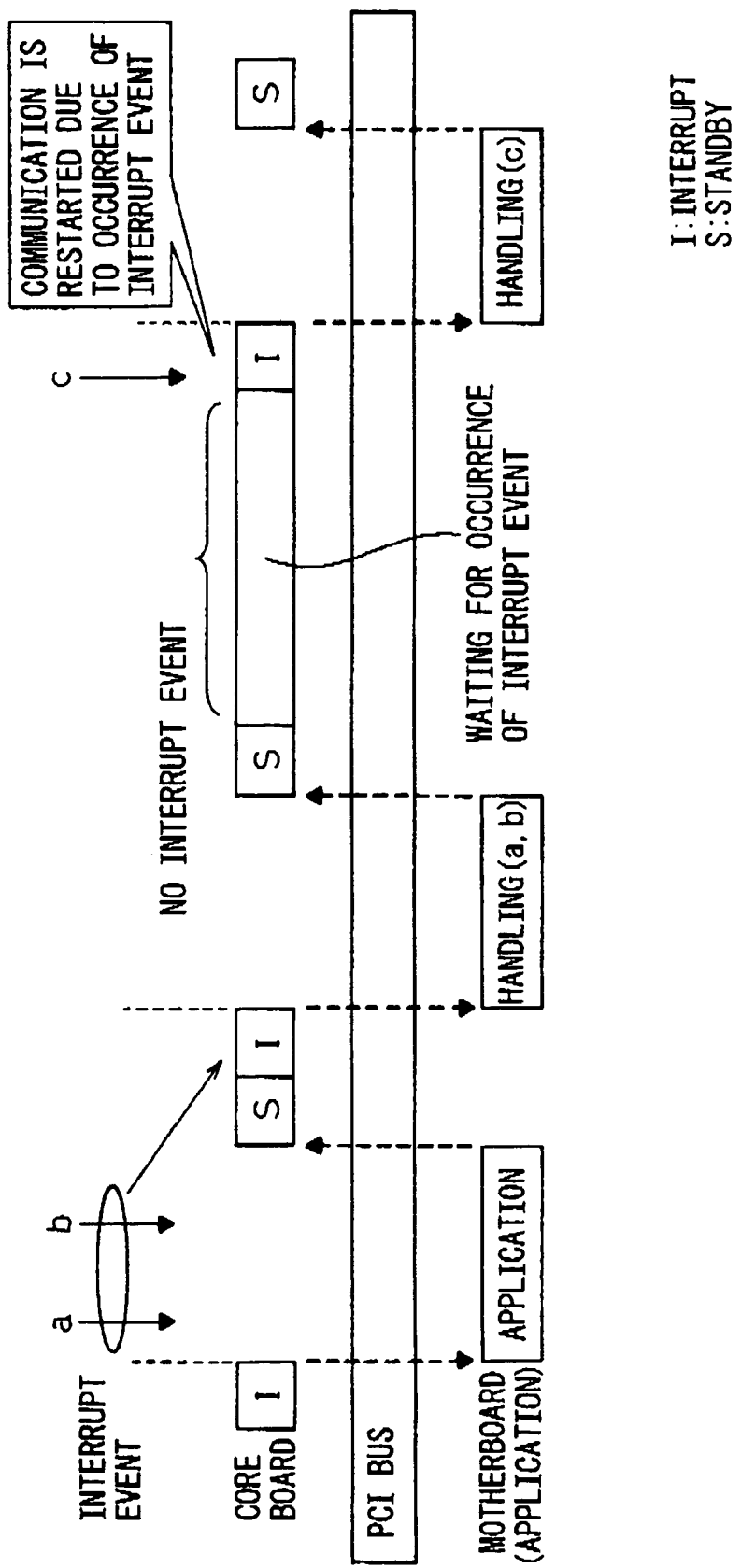

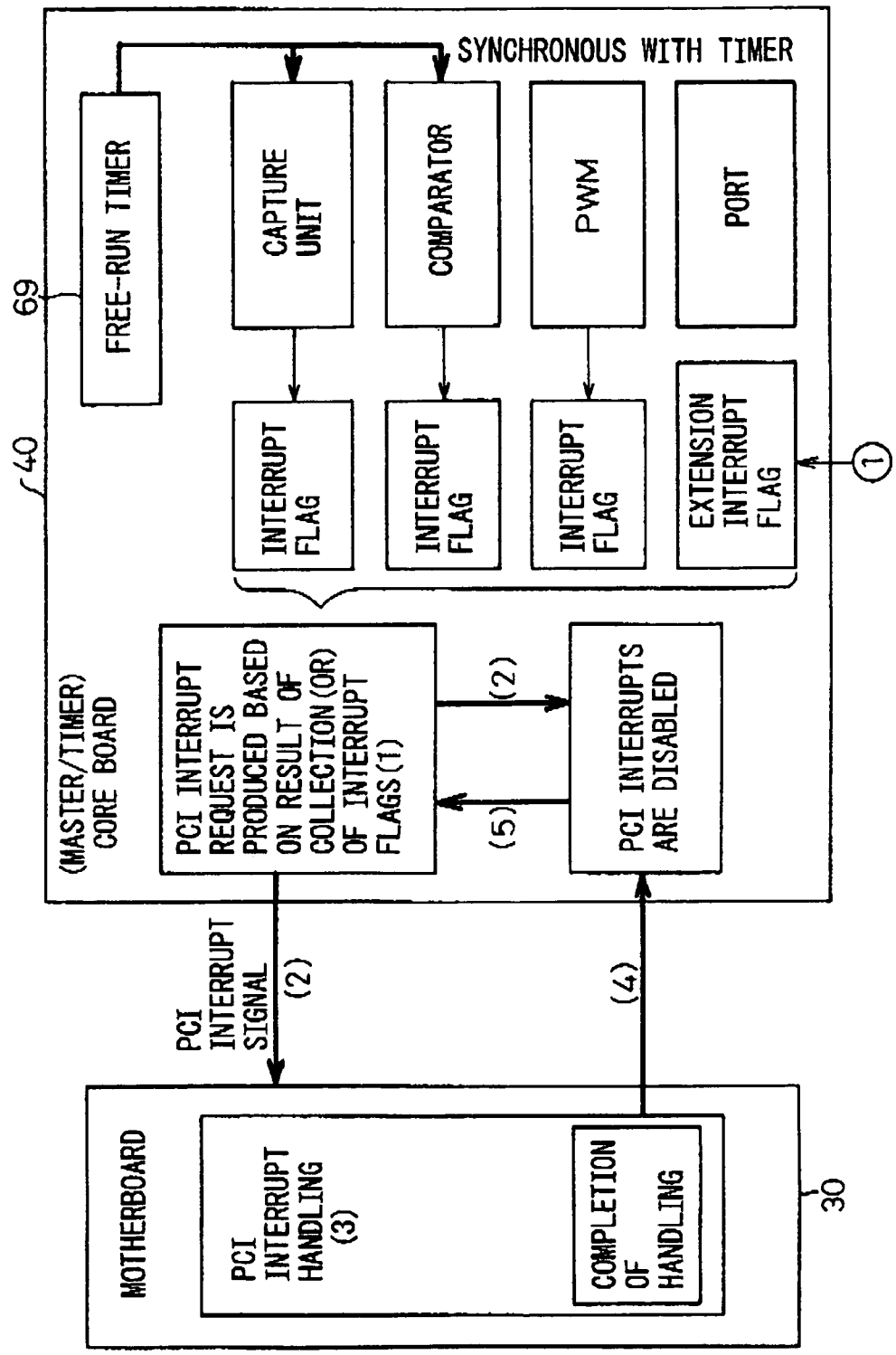

MICROCOMPUTER LOGIC DEVELOPMENT

CROSS-REFERENCE TO RELATED APPLICATION

This application claims priority from, and incorporates by reference, the entire disclosure of Japanese Patent Application No. 2003-024733 filed on Jan. 31, 2003.

BACKGROUND OF THE INVENTION

1. Field of the Invention

The present invention relates to a microcomputer logic development system and method. More particularly, the present invention relates to a system and method for developing logic to be implemented in a built-in microcomputer that is incorporated in an electronic control unit.

2. Description of the Related Art

The control of electronically controlled equipment, for example, the control of an engine by an electronic control unit (ECU) must be modified yearly in order to comply with regulations including emission regulations or to improve the performance of the ECU along with improvements in the performance of a microcomputer. At present, new logic is developed prior to the improvement in the performance of the existing ECU. The preceding logic often targets the new generation of microcomputers expected to enjoy improved performance. Moreover, a new-generation microcomputer enjoying improved performance is selected based on the performance required to implement the preceding logic.

However, an ECU having a new-generation microcomputer, which enjoys improved performance, incorporated therein is unavailable. The preceding logic is often developed using the logic implemented in an existing microcomputer as a base.

However, when an ECU having an existing microcomputer incorporated therein is used to develop the preceding logic, problems described below arise.

(1) The throughput of a CPU included in the microcomputer is insufficient.
(2) The storage capacity of a memory included in the microcomputer is insufficient.
(3) The number of peripheral resources is too small.
(4) It takes much time to develop and manufacture a new-generation ECU.

Due to the above problems, development of a new-generation microcomputer is delayed. This hinders development of new electrically controlled equipment to be controlled by an ECU in which the new-generation microcomputer is incorporated.

A built-in microcomputer that is incorporated in an existing electronic control unit has the performance of a CPU and the capability of the peripheral equipment selected based on the specifications optimal for an existing system in order to minimize the cost of the electronic control unit. Moreover, as the CPU and microcomputer peripheral resources are encased in one package, unless the microcomputer is modified, the capabilities of the CPU and peripheral resources cannot be modified independently of one another. Moreover, for development of logic to be implemented in the built-in microcomputer, a CPU whose throughput is large enough to implement the preceding logic must be procured, and the same assortment of microcomputer peripheral resources as the one to be included in a preceding system must be procured. Moreover, every time a new microcomputer is developed, an ECU must be manufactured in line with the microcomputer.

In order to solve the problems, an attempt has been made to realize the features of a built-in microcomputer with a one-chip microcomputer verification board (refer to, for example, FIG. 1 and FIG. 2 included in Japanese Unexamined Patent Application Publication No. 8-16425). The one-chip microcomputer verification board is formed with a printed-circuit board on which a general-purpose CPU, memories (RAM and ROM), programmable logic circuits (FPGAs), and programmable wiring elements (FPIC) for interconnecting the CPU, memories, and programmable logic circuits are mounted so that they can be replaced with new ones.

As far as the one-chip microcomputer verification board is concerned, logical features corresponding to a user circuit, input and output units, and a register unit which are adaptable to a system in which a one-chip microcomputer is employed are programmed in field-programmable gate arrays (FPGAs). An FPIC is used to determine the interconnections among the input/output terminals of the CPU, memories, and FPGAs. Moreover, in order to develop a different one-chip microcomputer verification board, a ROM, FPGAs, and an FPIC, suitable for a system to which the verification board is adapted, are newly produced and an old ROM, FPGAs, and an FPIC are replaced with the new ones.

In contrast, the present inventor et al. have already proposed a microcomputer logic development system, which enables development of preceding logic when a built-in microcomputer to be incorporated in an existing electronic control unit is replaced with an external high-performance microcomputer, for the purpose of developing general-purpose preceding logic (Japanese Unexamined Patent Application Publication No. 2003-167756).

In the microcomputer logic development system, an ECU generally comprises a motherboard having the capability of a CPU included in a microcomputer, a core board having the capabilities of input/output resources included in the microcomputer, and an interface board that accommodates hardware facilities. The motherboard and the core board are connected to each other over a peripheral component interconnect bus (a PCI bus) and communicate input/output information to each other. The performance of each board itself is determined by the performance of each of components mounted on the board.

However, whether the performance of each board can be effectively drawn out as the performance of the microcomputer logic development system itself is known to depend largely on a communication speed at which input/output information is transferred between the motherboard and core board, or the throughputs attained on the motherboard and core board. For example, when electrically controlled equipment is a high-performance engine control system, the problems described below arise.

(1) Abnormal input/output data greatly affects the engine control system.
(2) The number of passes that must be executed for initiating input/output operations at strict timing increases, and the processing time increases.
(3) The number of arithmetic/logic operations that deal with a large amount of data increases.

SUMMARY OF THE INVENTION

Accordingly, an object of the present invention is to provide a microcomputer logic development system adaptable to a higher-performance engine control system. Specifically, the microcomputer logic development system can realize reliable communication of input/output information between a motherboard and a core board, raise the communication speed at which input/output information is communicated, and improve the throughputs to be attained on the motherboard and core board.

A microcomputer logic development system in accordance with the present invention for accomplishing the above object can assume the first to twenty-second forms described below.

According to the first form, there is provided a logic development system for a built-in microcomputer that is incorporated in a control unit for use. The microcomputer logic development system comprises: a center block that includes an application facility and a communication facility; a peripheral block that includes quasi microcomputer peripheral devices which simulate by software the peripheral devices of a microcomputer so as to execute an input/output process, a computing facility, and a communication facility and that is connected to the center block over a PCI bus; and an interface circuit block that includes circuits equivalent to hardware devices included in an electronic control unit and that is connected to the peripheral block. Herein, the communication facility included in the center block and each of the quasi microcomputer peripheral devices included in the peripheral block are connected to each other over the PCI bus. Over the PCI bus, the communication facility and each of the quasi microcomputer peripheral devices transfer data directly to or from each other.

According to the second form, there is provided a logic development system for a built-in microcomputer that is incorporated in a control unit for use. The microcomputer logic development system comprises: a center block that includes an application facility and a communication facility; a peripheral block that includes quasi microcomputer peripheral devices which simulate, by software, the peripheral devices of a microcomputer so as to execute an input/output process, a computing facility, and a communication facility, and that is connected to the center block over a PCI bus; and an interface circuit block that includes circuits that accommodate hardware facilities included in the electronic control unit and that is connected to the peripheral block. Herein, the computing facility interposed between the communication facility included in the center block and the quasi microcomputer peripheral devices includes a bus controller. The communication facility in the center block and the bus controller are connected to each other over the PCI bus. The bus controller and the each of the quasi microcomputer peripheral devices are connected to each other over an internal bus. The communication facility and each of the quasi microcomputer peripheral devices transfer data directly to or from each other by way of the PCI bus, bus controller, and internal bus.

The third form is different from the first form in a point that a virtual input/output register is interposed between the communication facility in the center block and the PCI bus. Transfer data is temporarily stored in the virtual input/output register at the timing of receiving or transmitting data. Consequently, the virtual input/output register behaves like an input/output register included in an actual microcomputer.

According to the fourth form, an object on which the application facility employed in the first form acts is a vehicle, and the logic development system includes an ignition switch. The logic development system is interlocked with the on or off state of the ignition switch in order, similarly to an actual ECU 1, to initiate or terminate vehicle control software.

According to the fifth form, the circuits equivalent to hardware devices included in an electronic control unit and being included in the interface circuit block employed in the logic development system of the fourth form include at least one facility circuit in which a microcomputer is incorporated. The facility circuit is not actuated with the on state of the ignition switch but is actuated at the timing of starting processing on the center block.

According to the sixth form, the facility circuit employed in the logic development system of the fifth form includes a power circuit that is actuated with the on state of the ignition switch, and a logic circuit that, when both a signal sent from the power circuit and a signal sent from the center block are validated, actuates the microcomputer.

According to the seventh form, when the ignition switch employed in the logic development system of the fourth form is turned off, data that should be held is stored in either of a memory included in an external storage device connected to the logic development system and a memory included in the logic development system. When the ignition switch is turned on, the data that should be held is read from the external storage device and restored. Thus, the same capability as a backup memory is included in the logic development system.

According to the eighth form, initial values to which ports are set are determined within an initialization routine executed by the center block until the ignition switch is turned on after the power supply of the logic development system of the fourth form is turned on.

According to the ninth form, the PCI bus employed in the logic development system of the first form includes a one-channel interrupt signal line over which an interrupt request is issued from the peripheral block to the center block. When the peripheral block activates the interrupt signal line, the application facility included in the center block accepts the interrupt request. After the interrupt request is accepted, the application facility acts to inactivate the interrupt signal line.

According to the tenth form, when interrupt handling is terminated, the application facility included in the center block employed in the logic development system of the ninth form checks if the interrupt signal line is inactive.

According to the eleventh form, when interrupt handling is terminated, if the interrupt signal line is active, the application facility included in the center block employed in the logic development system of the tenth form acts to inactivate the interrupt signal line.

According to the twelfth form, the computing facility employed in the logic development system of the first form includes a facility for temporarily fetching data. When a large amount of data is transferred between the center block and each of the quasi microcomputer peripheral devices included in the peripheral block, the large amount of data is transferred in a burst mode between the center block and the computing facility. Between the computing facility and each of the quasi microcomputer peripheral devices, a small amount of data is transferred in a non-burst mode.

According to the thirteenth form, after an interrupt request is accepted, the application facility in the center block employed in the logic development system of the ninth form acquires interrupt flags from the quasi microcomputer peripheral devices over the PCI bus. When the application facility acquires the interrupt flags, the application facility clears the interrupt flags present in the quasi microcomputer peripheral devices.

According to the fourteenth form, when the application facility in the center block employed in the logic development system of the thirteenth form acquires the interrupt flags, the application facility executes a process associated with each of the acquired interrupt flags.

According to the fifteenth form, after an interrupt request is accepted, the application facility in the center block employed in the logic development system of the fourteenth form acquires a plurality of interrupt flags from the quasi microcomputer peripheral devices over the PCI bus. The application facility selects one interrupt flag assigned a high priority, and executes a process associated with the flag. After the process is terminated, the application facility clears a process completion interrupt flag in the quasi microcomputer peripheral device concerned.

According to the sixteenth form, after the application facility employed in the logic development system of the fifteenth form selects one interrupt flag assigned a high priority and executes a process associated with the flag, the application facility acquires a plurality of interrupt flags from the quasi microcomputer peripheral devices over the PCI bus.

According to the seventeenth form, the interrupt flags employed in the logic development system of the thirteenth form are concurrently stored at successive addresses in one register included in each of the quasi microcomputer peripheral devices.

According to the eighteenth form, a plurality of peripheral blocks, one of which is employed in the logic development system of the seventeenth form, are included, and interrupt flags assigned to resources, which cause an interrupt and are included in each of the peripheral blocks, are stored in each register included in each of the peripheral blocks. Interrupt flags assigned to resources included in the first peripheral block are stored in a register included in the first peripheral block. An extension interrupt flag indicating whether interrupt flags assigned to resources included in each of the remaining peripheral blocks are present is stored in association with each of the remaining peripheral blocks.

According to the nineteenth form, if the extension interrupt flag employed in the logic development system of the eighteenth form demonstrates that interrupt flags are stored in a register included in any of the remaining peripheral blocks, the application facility acquires the interrupt flags from the register in the remaining peripheral block.

According to the twentieth form, a plurality of peripheral blocks each of which is employed in the logic development system of the first form is included, and a free-run timer is included in the first peripheral block alone. Resources that are actuated synchronously with a timer value of the free-run timer are included in the first peripheral block, and resources independent of the free-fun timer are included in the remaining peripheral blocks.

According to the twenty-first form, the resources that are actuated synchronously with the timer value of the free-run timer employed in the logic development system of the twentieth form include a comparator and a capture unit. The resources independent of the free-run time include a pulse-width modulator (PWM), a communication unit, an analog-to-digital (A/D) converter, and ports.

According to the twenty-second form, there is provided a logic development system for a built-in microcomputer that is incorporated in an electronic control unit for use. The microcomputer logic development system comprises: a center block including an application facility; a peripheral block including quasi peripheral devices which simulate the peripheral devices of a microcomputer so as to execute an input/output process; and a PCI bus over which the center block and the peripheral block are connected to each other. When an interrupt factor occurs in any of the quasi peripheral devices, the application facility reads or writes data from or in the quasi peripheral device. Data whose processing speed is required to be low is concurrently read or written during communication performed before or after the action of the application facility.

In all of the foregoing forms, the center block, peripheral block, and interface circuit block can be formed with general-purpose circuit boards. Moreover, the microcomputer logic development system in accordance with the present invention can be effectively adapted to a microcomputer for use in controlling an internal combustion engine.

Moreover, the present invention provides methods as twenty-third and twenty-fourth forms thereof.

The twenty-third form of the present invention is a logic development method for a microcomputer requiring: a center block including an application facility; a peripheral block including quasi microcomputer peripheral devices that simulate by software the peripheral devices of a microcomputer so as to execute an input/output process; an interface circuit block including circuits equivalent to hardware devices included in an electronic control unit; and a PCI bus over which the center block and the peripheral block are connected to each other. The microcomputer logic development method comprises: a step of issuing an interrupt request from the peripheral block to the center block over a one-channel interrupt signal line contained in the PCI bus; a step of accepting the interrupt request when the peripheral block activates the interrupt signal line; and a step of after the interrupt request is accepted, inactivating the interrupt signal line.

According to the twenty-fourth form, the microcomputer logic development method of the twenty-third form further comprises: a step of after an interrupt request is accepted, acquiring interrupt flags from the quasi microcomputer peripheral devices over the PCI bus; and a step of, after the interrupt flags are acquired, clearing the interrupt flags present in the quasi microcomputer peripheral devices.

According to the microcomputer logic development system of the present invention having the foregoing constituent features, problems underlying development of logic to be implemented in a microcomputer are solved. A CPU will enjoy the performance required for implementing novel logic or new-generation logic. The same assortment of resources as the one included in a novel or new-generation system can be provided as microcomputer peripheral resources. A built-in microcomputer in which the novel or new-generation logic can be implemented can be developed in a short period of time. Moreover, as the microcomputer logic development system in accordance with the present invention is repeatedly usable for development of logic, the cost of development can be minimized.

BRIEF DESCRIPTION OF THE DRAWINGS

The present invention will be more clearly understood from the description set forth below with reference to the accompanying drawings, wherein:

FIGS. 7A and 7B are timing charts indicating issuance of an interrupt signal over the PCI bus linking the motherboard and core board and transfer of data in relation to the passage of time;

FIGS. 10A and 10B describe the processing steps that are included in the power-on sequence and that involve the motherboard, core board, and facility board whose configurations are shown in FIG. 9;

FIGS. 11A and 11B describe the processing steps that are continued from the processing steps described in FIGS. 10A and 10B, and also describes the processing steps included in a power-off sequence;

FIGS. 12A and 12B are timing charts indicating PCI interrupt handling that is triggered by a PCI interrupt signal sent over an interrupt signal line A shown in FIGS. 7A and 7B;

FIGS. 13A and 13B are timing charts indicating an example of a PCI access method which is employed in the present invention and, according to which, a register included in each of FPGAs on the core board is accessed directly from the motherboard over the PCI bus in order to read or write data;

FIG. 15 shows the contents of registers included in an FPGA that serves as a capture unit, (a) shows the contents of an interrupt flag register, and (b) shows the contents of a captured value register;

FIG. 17 is a timing chart concerning a process executed according to the present invention when occurrence of an interrupt event is discontinued; and FIGS. 18A and 18B are explanatory diagrams concerning synchronization performed on a plurality of core boards from a motherboard.

DESCRIPTION OF THE PREFERRED EMBODIMENTS

Referring to the appended drawings, an embodiment of the present invention will be described in conjunction with concrete examples. In the examples, electronically controlled equipment to which the present invention is adapted shall be an electronically controlled internal combustion engine (hereinafter, an electronically controlled engine).

Figure 1:
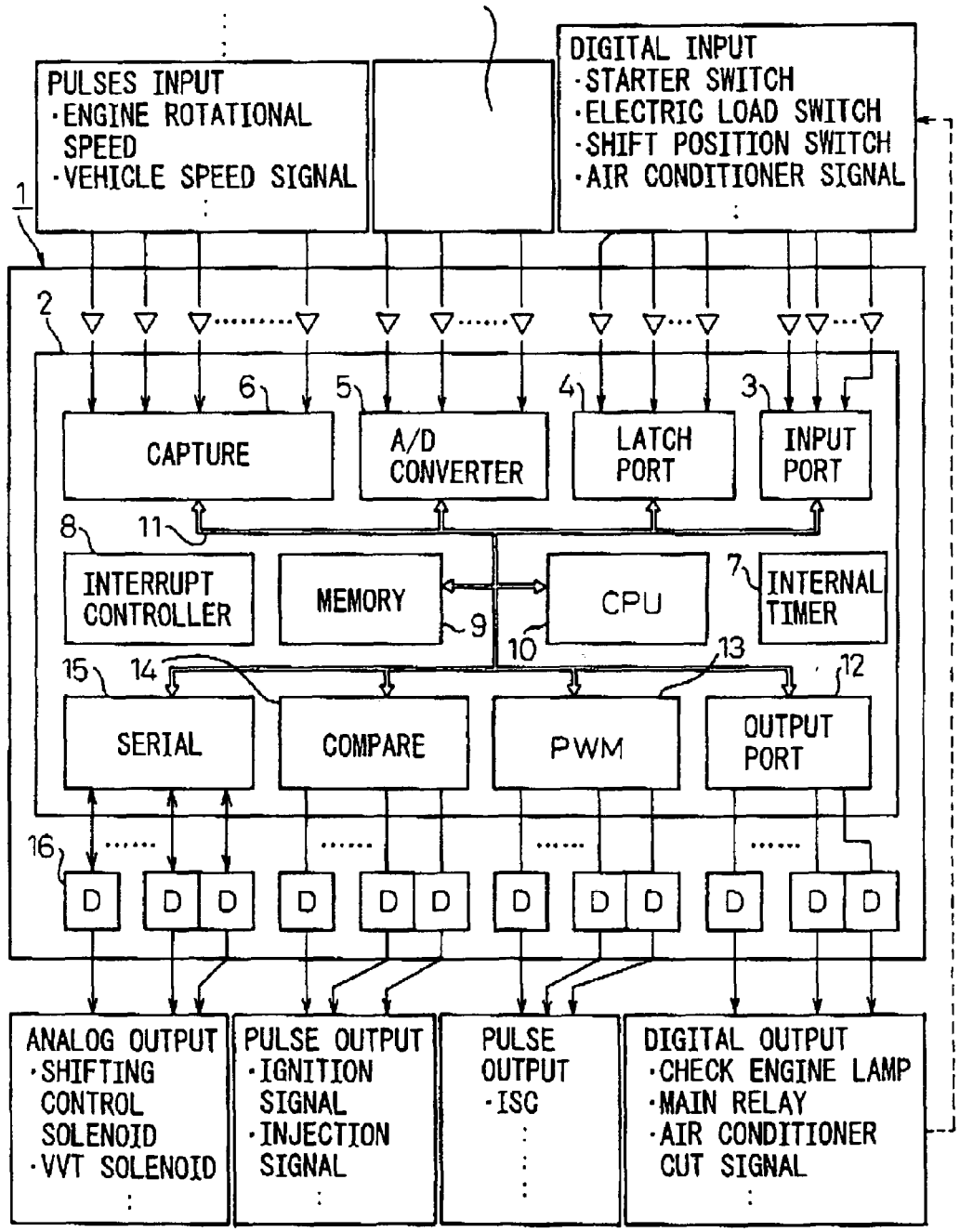
FIG. 1 shows the system configuration of an electrically controlled engine control system that is the background of the present invention so as to show the configuration of an ECU.

FIG. 1 shows the system configuration of a conventional electronically-controlled-engine control system so as to show the configuration of an electronic control unit (ECU) 1. In the electronically-controlled-engine, the ECU 1 receives pulsating signals such as an engine speed signal and a vehicle speed signal, analog signals sent from a coolant temperature sensor and an intake air temperature sensor, and digital signals sent from a starting switch, an electric load switch, a shifting position switch, and an air conditioner. The ECU 1 comprises: a built-in microcomputer 2 that handles these input signals; and drivers 16 that are ECU input/output circuits for amplifying and transmitting signals handled by the built-in microcomputer 2. The ECU 1 transmits analog signals to be sent to a shift control solenoid and a variable valve timing (VVT) solenoid, pulsating signals such as an ignition signal and a fuel injection signal, a pulsating signal for idle speed control (ISC), and digital signals to be sent to a check engine warning lamp and a main relay, and a digital signal instructing the switching-off of an air conditioner.

The built-in microcomputer 2 has a memory 9 and a CPU 10 that are needed for arithmetic/logic operations, and peripheral resources that are responsible for input/output control, encased in one package. The peripheral resources fall into input resources and output resources. Referring to FIG. 1, an input port 3 and a latch port 4 that deal with a digital signal, an A/D converter 5 that handles an analog signal, and a capture unit 6 that handles a pulsating signal are shown as the input resources. An output port 12 through which a digital signal is transmitted, a pulse-width modulator (PWM) 13 and a comparator 14 that transmit a pulsating signal, and a serial interface 15 through which an analog signal is transmitted or received are shown as the output resources. The peripheral resources, the memory 9, and the CPU 10 are interconnected over an internal bus 11. In addition to the peripheral resources, an internal timer 7 and an interrupt controller 8 are included in the built-in microcomputer 2. All the terminals of the built-in microcomputer 2 shall be referred to as ports.

In the electronically controlled engine control system, the ECU 1 receives signals, which indicate the driven state of a vehicle, from sensors and switches. An input circuit in the ECU 1 processes input signals, and transfers the resultant signals to the built-in microcomputer 2. The input peripheral resources convert the received signals into CPU values. The memory 9 and CPU 10 that constitute a computing unit detect the state of the vehicle from the input signals, and produce an output request signal according to the state of the vehicle. The output peripheral resources convert the output request signal into output signals. Consequently, the output signal is transmitted from the built-in microcomputer 2. The drivers 16 serving as input/output circuits included in the ECU 1 drive actuators incorporated in the vehicle according to the output signals. The results of output control are, as indicated with a dashed line, reflected on the input signals received from the vehicle.

Figure 2:
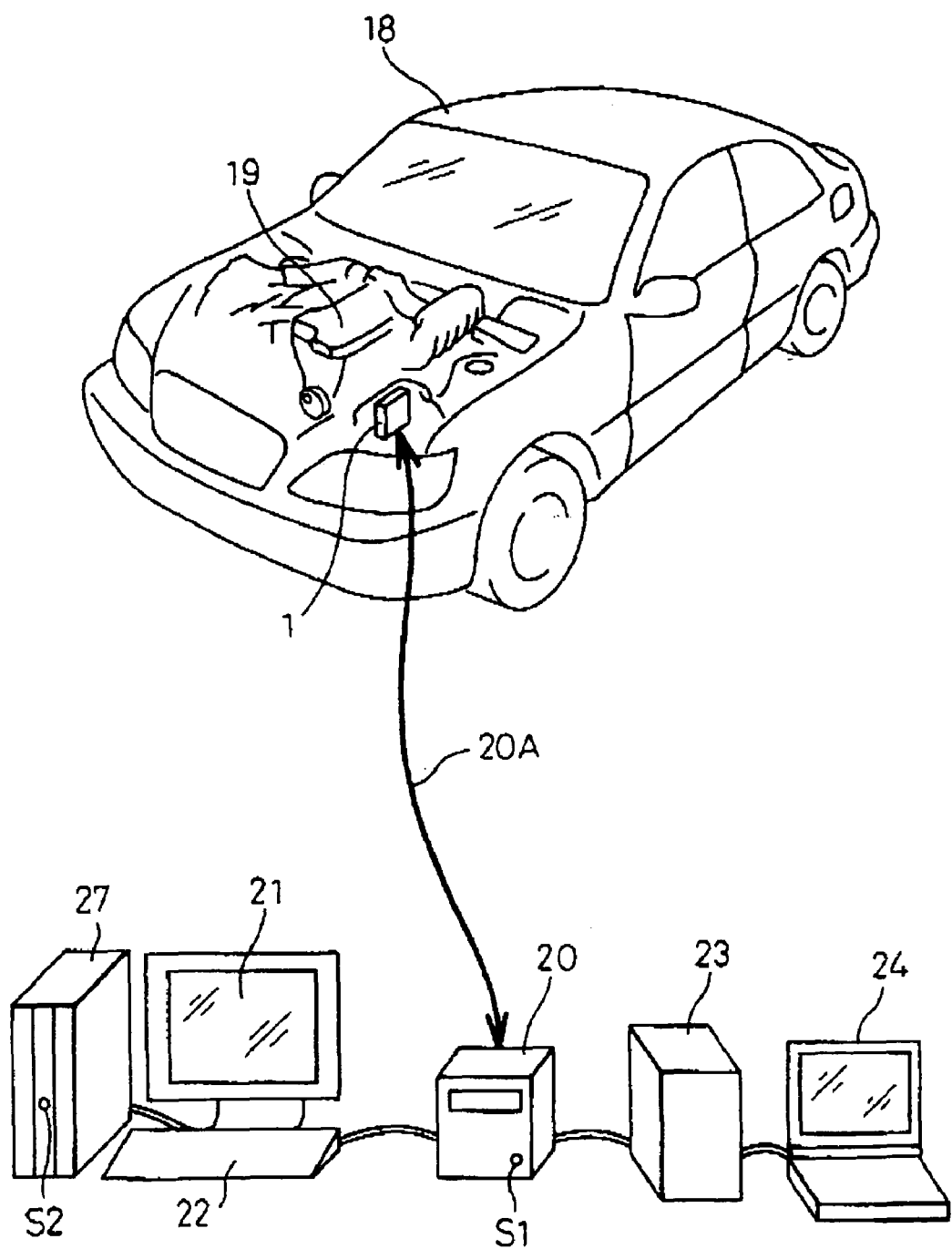
FIG. 2 is an explanatory diagram showing the overall configuration of a microcomputer logic development system in accordance with the present invention that is used to develop logic to be implemented in the ECU shown in FIG. 1.

FIG. 2 shows the position of the ECU 1 described in conjunction with FIG. 1 in an automobile (vehicle) 18. The ECU 1 is located in an engine compartment in which an engine 19 of the vehicle 18 is mounted. Moreover, FIG. 2 shows a microcomputer logic development system 20 in accordance with the present invention. The microcomputer logic development system 20 in accordance with the present invention is, as illustrated, directly connected to the ECU 1 over a connection cord 20A that is spliced to a connector that is uncoupled from the ECU 1 mounted on the vehicle 18.

The microcomputer logic development system 20 in accordance with the present invention is connected to host computer 27. The host computer 27 comprises a display 21 and a keyboard 22 that is used to enter data. Reference numerals S1 and S2 denote power switches that are used to actuate the logic development system 20 and host computer 27 respectively. The state of the microcomputer logic development system 20 can be monitored using the display 21. Data can be entered at the keyboard 22 in order to modify the settings of the microcomputer logic development system 20.

Incidentally, the microcomputer logic development system 20, in accordance with the present invention, is, as mentioned above, used while being directly connected to the vehicle 18. Otherwise, the microcomputer logic development system 20 may be connected to a vehicle driving situation generation system 23 that is operated under the control of a personal computer 24 and that can simulate various vehicle driving situations. In this case, even when the vehicle 18 is unavailable, logic to be implemented in a built-in microcomputer for use in controlling an electronically controlled engine can be developed.

Figure 3:
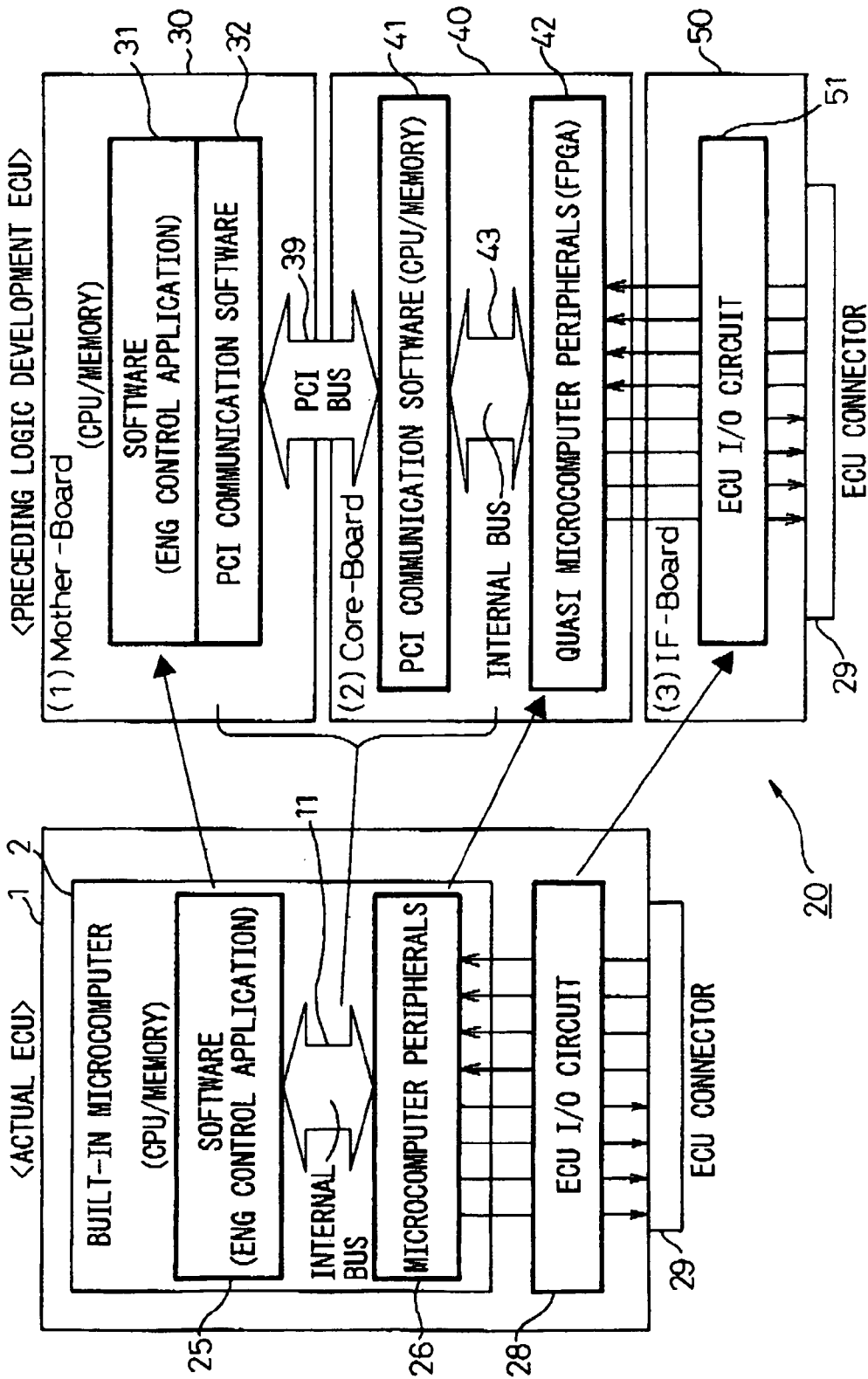
FIG. 3 is a block diagram showing the configuration of the microcomputer logic development system in accordance with the present invention in comparison with the configuration of a conventional electronic equipment control ECU.

FIG. 3 shows the system configuration of the microcomputer logic development system 20 in accordance with the present invention, which can be used while being connected as shown in FIG. 2, in comparison with the configuration of the conventional ECU 1 for controlling electronically controlled equipment (herein an electronically controlled engine). As mentioned above, the ECU 1 comprises the built-in microcomputer 2 and ECU input/output circuits 28 formed with the drivers 16, and is connected to the electronically controlled equipment mounted in a vehicle through an ECU connector 29. Moreover, software (engine control application wherein "engine" is abbreviated to "ENG" the drawing) 25 that is stored in the memory 9 and read and used by the CPU 10 is installed in the built-in microcomputer 2. Microcomputer peripheral resources ("microcomputer resources" the drawing) 26 are included in the built-in microcomputer 2. The software 25 and the microcomputer peripheral resources 26 transfer data to or from each other over the internal bus 11.

On the other hand, as described in conjunction with FIG. 2, the microcomputer logic development system 20 in accordance with the present invention that is substituted for the ECU 1 comprises, in the present example, three circuit boards: that is, a motherboard 30 realizing a center block; a core board 40 realizing a peripheral block; and an interface board 50 realizing an interface circuit block. The motherboard 30 and the core board 40 correspond to the built-in microcomputer 2 of the ECU 1, while the interface board 50 corresponds to the ECU input/output circuits 28 of the ECU 1. The motherboard 30 and the core board 40 are connected to each other over a PCI bus 39 serving as a high-speed bus interface.

Software (ENG control application) 31 that is stored in a memory to be described later, and read and used by the CPU, and PCI communication software 32 that permits communication over the PCX bus 39, are installed on the motherboard 30. PCI communication over the PCI bus 39 refers to communication of data, which is transferred to or from quasi microcomputer peripheral resources (abbreviated to "quasi microcomputer peripherals" in the drawing) 42, over the PCI bus 39. For development of a new-generation ECU, the motherboard 30 must be designed to offer a high throughput and a large storage capacity so that it can withstand a load to be imposed during development of preceding logic to be implemented in the new-generation ECU.

Incidentally, the performance of an existing microcomputer for use in controlling an engine is such that the operating frequency of a CPU is 64 MHz and the storage capacity of a memory is about 1 megabyte. A general-purpose microcomputer such as the one employed in personal computers would exhibit sufficient performance, and could be reused many times over a long period of time.

Moreover, the core board 40 accommodates a CPU and a memory, and includes the PCZ communication software 41 that permits communication over the PCI bus 39, and quasi microcomputer peripherals (or field-programmable gate arrays (FPGAs) 42 that correspond to the microcomputer peripheral resources 26 of the built-in microcomputer 2). The PCI communication software 41 and each of the quasi microcomputer peripherals 42 can transfer data to or from each other over an internal bus 43. Herein, ports refer to all the terminals of the FPGAs 42.

The interface board 50 accommodates ECU input/output circuits 51 corresponding to the ECU input/output circuits 28 of the ECU 1, and an ECU connector 29. The ECU input/output circuits 51 are formed with standard circuit blocks that are independent of one another, so that the ECU input/output circuits 51 can cope with a change in the number of input/output circuits incorporated in the ECU.

Figure 4:
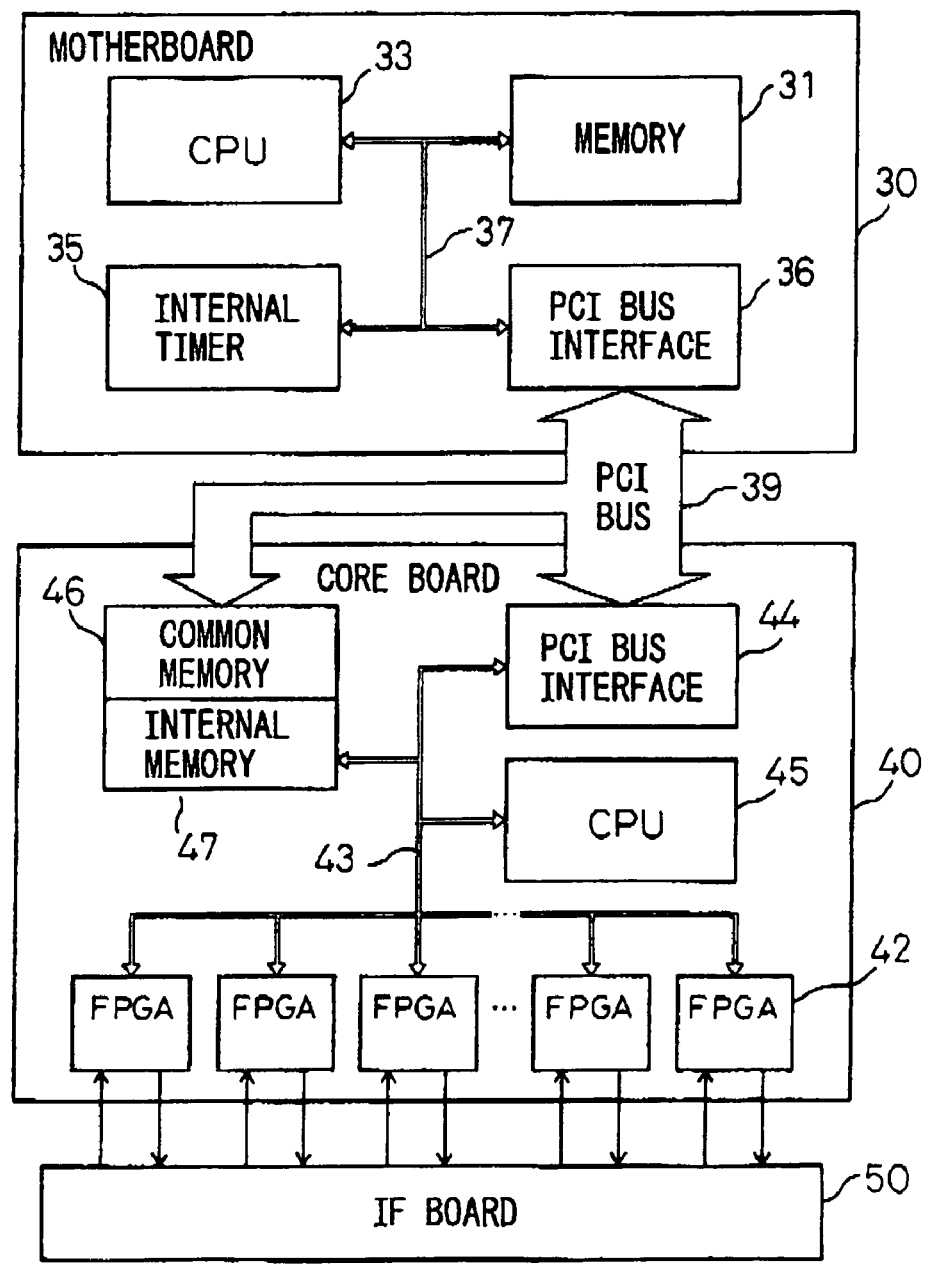
FIG. 4 is a block diagram showing an example of the internal components mounted on a motherboard and a core board shown in FIG. 3.

FIG. 4 shows an example of the hardware configurations of the motherboard 30 and core board 40 shown in FIG. 3. The motherboard 30 accommodates a memory 31 whose storage capacity is large enough to store the software (ENG control application) described in conjunction with FIG. 3, a general-purpose high-performance CPU (whose operating frequency is, for example, 850 megahertz) 33, an internal timer 35, a PCI bus interface 36 connected on the PCI bus 39, and an internal bus 37 over which the memory, CPU, internal timer, and PCI bus interface are interconnected.

The core board 40 accommodates a PCI bus interface 44 connected on the PCI bus 39, a CPU 45 that is of a lower grade than the CPU 33 mounted on the motherboard 30, quasi microcomputer peripherals (FPGAs) 42 that realize the capabilities equivalent to the capabilities of the microcomputer peripherals, an internal bus 43, a common memory 46 connected on the PCI bus, and an internal memory 47 connected on the internal bus 43. The CPU 45 mounted on the core board 40 should offer the throughput (for example, a general-purpose 32-bit CPU whose operating frequency is about 16 megahertz) high enough to perform PCI communication. The core board 40 has the capability to receive data, which is transferred between the ENG control application (software) 25 installed in the conventional ECU 1 and each of the microcomputer peripherals 26, over the PCI bus 39, and to then transfer the data to the FPGAs 42.

The FPGAs connected to the interface board 50 can be realized by software, and the number of FPGAs can flexibly be varied to cope with a change in the number of the microcomputer peripherals. Namely, the number of FPGAs can be varied to cope with an increase in the number of channels or addition of a resource having an unprecedented capability.

Figure 5:
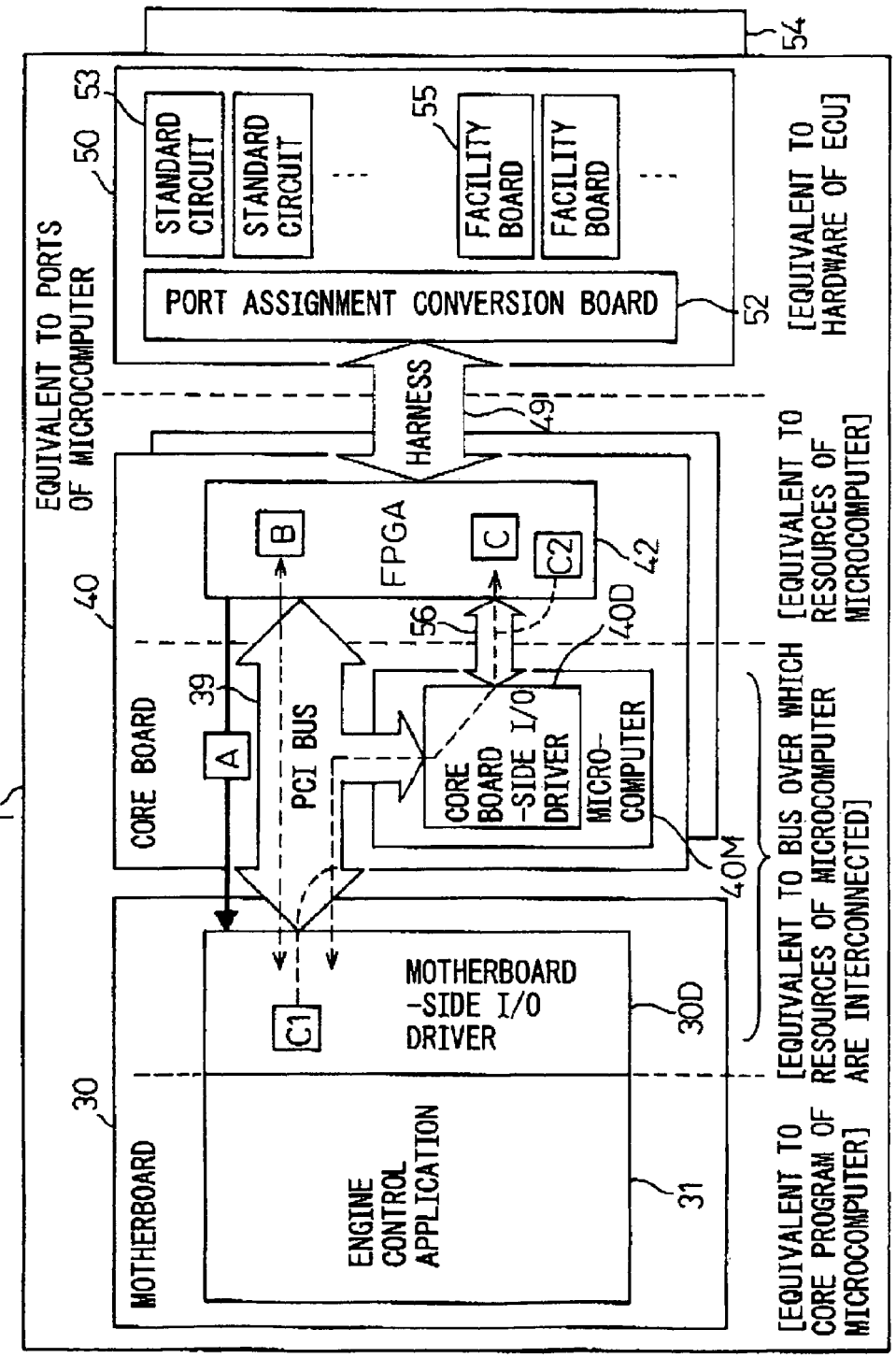
FIG. 5 shows the software configurations of the motherboard and core board included in the microcomputer logic development system in accordance with the present invention, and also shows the hardware configuration of an interface board.

FIG. 5 shows the configuration of the software (including part of the hardware) installed in the ECU 1 simulated by the microcomputer logic development system 20 in accordance with the present invention. The ECU 1 is simulated using: the motherboard 30 that realizes a capability equivalent to the capability of a core program of a microcomputer; the core board that realizes a capability equivalent to the capabilities of the resources of the microcomputer; and the interface board 50 that realizes a capability equivalent to the capability of the hardware of the ECU 1. Herein, the hardware of the ECU 1 refers to electric circuits other than the microcomputer.

Input/output drivers (a motherboard-side input/output driver 30D and a core board-side input/output driver 40D) that realize a capability equivalent to the capability of the bus over which the motherboard is connected to each of the microcomputer resources are mounted on the motherboard 30 and core board 40 respectively. The input/output drivers are connected to each other over the PCI bus 39. The PCI bus 39 contains a one-channel interrupt signal line A. Over the signal line A, an interrupt request is issued from the core board 40 to the motherboard 30.

Moreover, the PCI bus 39 is coupled to each of the motherboard 30, the core board-side input/output driver 40D included in a microcomputer 40M mounted on the core board 40, and the FPGAs 42. Over the PCI bus 39 employed in the present invention, the motherboard 30 and each of the FPGAs 42 can transfer data to or from each other according to the following two methods: direct access between the motherboard 30 and each of the FPGAs 42 along a path B, and access between the motherboard 30 and each of the FPGAs 42 via the core board-side input/output driver 40D along a path C.

Figure 6:
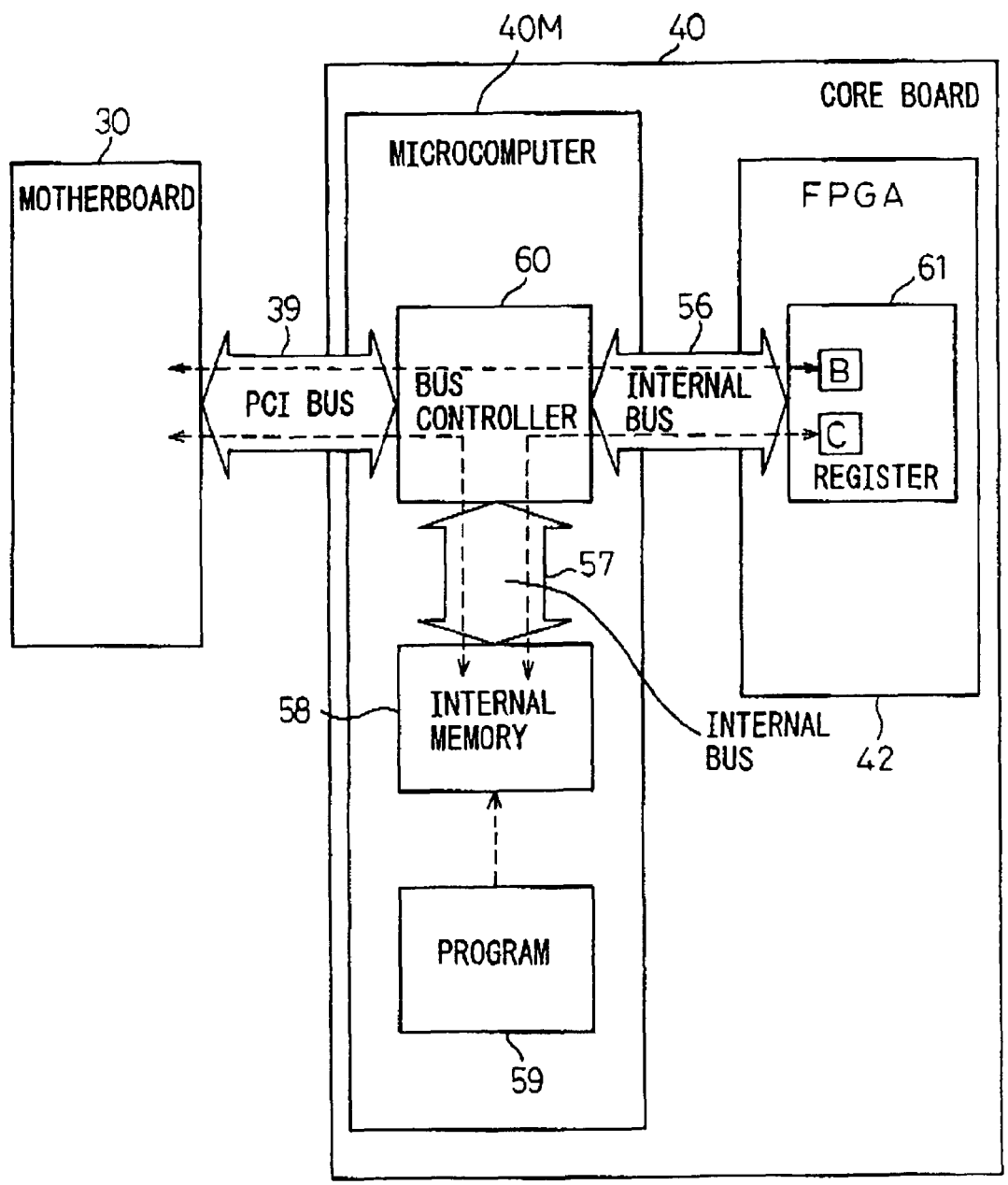
FIG. 6 is an explanatory block diagram showing a PCI bus shown in FIG. 5 and the actual configuration of a microcomputer mounted on the core board.

According to the present invention, as shown in FIG. 5, the motherboard-side input/output driver 30D and each of the FPGAs 42 can transfer data to or from each other over the PCI bus 39 as if they directly accessed each other. In reality, the hardware on the core board 40 includes a bus controller. The bus controller will be described in conjunction with FIG. 6. As shown in FIG. 6, the microcomputer 40M on the core board 40 comprises an internal memory 58, a program 59, and a bus controller 60. The bus controller 60 is connected to the motherboard 30 over the PCI bus 39, and connected to a register 61 included in each of the FPGAs 42 over an internal bus 56 of the core board 40. Moreover, the bus controller 60 is connected to the internal memory 58 over an internal bus 57 of the microcomputer 40M.

In terms of hardware, the buses have a single-layer structure. When data is directly transmitted from the motherboard 30 to the register 61 in each of the FPGAs 42 over the PCI bus 39 and internal bus 56 via the bus controller 60, the motherboard 30 and register 61 are connected to each other as if they were joined by hardware. In other words, although data is internally transmitted via the bus controller 60, it appears externally that data is directly written from the motherboard 30 into the FPGA 42 or that data is directly read from the FPGA 42 into the motherboard 30. Therefore, it appears as if data were transferred between the motherboard 30 and FPGA 42 over the PCI bus 39 that is one of the buses shown in FIG. 5.

The bus controller 60 can change the directions of a data flow. Data received by the bus controller 60 can be temporarily written in the internal memory 58 over the internal bus 57. Along the path line B, data is transferred between the motherboard 30 and each of the FPGAs 42 by way of the PCI bus 39, bus controller 60, and internal bus 56. Along the path line C, when data is temporarily written in the internal memory 58 because the program 59 is run while the data is being rout d through the PCI bus 38, bus controller 60, and internal bus 56. The stage in which the program 59 runs is equivalent to the stage of the core board-side input/output driver 40D shown in FIG. 5.

Referring back to FIG. 5, the interface board 50 equivalent to the hardware of the ECU 1 comprises a port assignment conversion board 52, a plurality of standard circuits 53, and a plurality of facility boards 55. Any number of input/output circuits can be realized by combining the port assignment conversion board, standard circuits, and facility boards. Moreover, reference numeral 54 denotes an equivalent of the ECU connector 29 shown in FIG. 3. The interface board 50 and the core board 40 are connected to each other over a harness 49 equivalent to the ports of the microcomputer.

The facility boards 55 are provided for executing facilities of the engine control application 31. A difference from the standard circuits 53 lies in a point that a microcomputer is incorporated in each of the facility boards. Normally, the standard circuits 53 merely have the capability to switch on and off states. The facility boards 55 have a communication capability due to the incorporation of the microcomputer. In other words, the facility boards 55 can transfer data to or from the FPGAs 42 according to the direct memory access (DMA) technique, and can realize the facilities nested in the engine control application 31. Transfer of data using these components is one of the constituent features of the present invention.

Incidentally, when the electronically controlled equipment is an electronically controlled engine, the motherboard 30 has two large software blocks, that is, the engine control application 31 and the input/output driver 30D that communicates input/output information between the application 31 and each of the FPGAs 42. The engine control application 31 includes a block containing arithmetic/logic operations alone and a block containing both input/output operations and arithmetic/logic operations. The block containing both input/output operations and arithmetic/logic operations is substantially equivalent to software installed in the actual ECU. The block containing arithmetic/logic operations alone is an additional review logic block and completely separated from the input/output operations. The input/output drivers include, as mentioned above, the motherboard-side input/output driver 30D and core board-side input/output driver 40D, and are synchronized over the PCI bus 30 so as to transmit input/output information.

The block containing arithmetic/logic operations alone and being nested in the engine control application 31 achieves temporal synchronization (temporal interrupt handling) alone. The block containing both input/output operations and arithmetic/logic operations achieves both temporal synchronization and non-temporal synchronization (non-temporal interrupt handling). The temporal synchronization does not depend on an external state but is executed at regular intervals. On the other hand, the non-temporal synchronization depends on an external state, that is, the driven state of an engine. The non-temporal synchronization includes handling of an interrupt caused by, for example, an engine speed signal, a vehicle speed signal, a fuel injection timing signal, or an injection timing signal.

Herein, a phenomenon that varies at random depending on an external state shall be called an event. The non-temporal synchronization can be regarded as a process to be executed synchronously with an event represented by event information detected based on an external state.

In order to execute the temporal synchronization and non-temporal synchronization within the engine control application 31 installed on the motherboard 30, the CPU 33 on the motherboard 30 described in conjunction with FIG. 4 acts as a virtual microcomputer peripheral. The virtual microcomputer peripheral includes a virtual interrupt controller that causes a temporal interrupt or a non-temporal interrupt, and a virtual input/output register. Moreover, the motherboard-side input/output driver 30D serving as PCI communication software handles as a data interrupt event information and input/output register data.

On the other hand, the FPGAs (quasi microcomputer peripherals) 42 on the core board 40 are, similarly to the conventional microcomputer peripherals 26 shown in FIG. 3, assigned the capabilities of input, output, and latch ports, a pulse-width modulator (PWM), a serial interface, a comparator, and a capture unit. Moreover, the core board-side input/output driver 40D serving as PCI communication software handles as data interrupt event information and input/output register data. Furthermore, a timer that induces an event flow is incorporated in the core board 40.

Now, assuming that an object of control is an engine of a vehicle, a description will be made of an overall flow of transfer of event information and data between the motherboard 30 and core board 40, which is performed in the microcomputer logic development system 20 in accordance with the present invention, in conjunction with FIGS. 7A and 7B of the timing chart and FIGS. 8A and.8B showing a software configuration. Thereafter, processes whose timings are indicated in the timing charts of FIGS. 7A and 7B will be detailed based on a concrete example.

In the example described below, an event flow is indicated with a solid line, and a data flow is indicated with a dashed line.

(1) Communication Method between the Motherboard 30 and Core Board 40

Figure 7A:
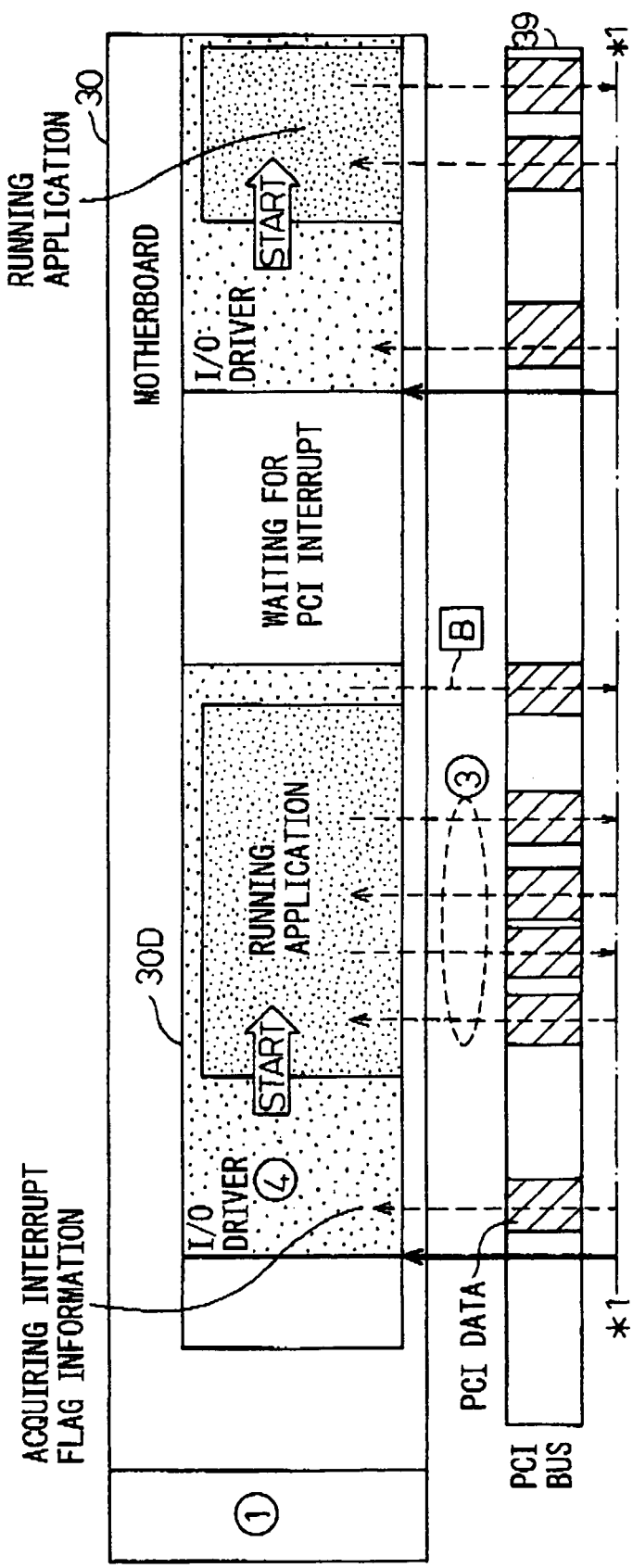

FIGS. 7A and 7B are timing charts indicating the flow of data between the motherboard 30 and core board 40 deriving from issuance of an interrupt request. In FIGS. 7A and 7B, processes involving the motherboard 30, PCI bus 39, and core board 40 are indicated with the passage of time. A plurality of core boards 40 may be, as illustrated, employed. Control to be extended when a plurality of core boards 40 is employed will be described later. The present example will be described on the assumption that one core board 40 is employed. Moreover, one cycle of processing starts with the start S of waiting for occurrence of an interrupt on the core board 40 and ends with the reception E of an application completion notification. The processing cycle is repeated thereafter. The one processing cycle will therefore be described below.

(1-1) Interrupt Timing

The engine control software (application) installed on the motherboard 30 runs when initiated with an external event (timeout indicated by a timer in any of the FPGAs 42, or reception of an engine speed signal, a vehicle speed signal, or a communication signal). The logic development system can replace occurrence of the external event with setting of an interrupt flag. Therefore, the engine control software includes an interrupt routine that is initiated with an external interrupt flag. When an external interrupt flag is received, the interrupt routine is initiated. The interrupt routine is initiated on a hardware basis and acts on an interrupt signal. The interrupt routine is therefore called an interrupt handler.

The motherboard 30 does not have an interrupt feature. An event transmission means is limited to one PCI interrupt channel (signal line A). Therefore, the microcomputer on the core board 40 monitors interrupt flags. When any interrupt flag becomes valid, a signal is transmitted over the one-channel interrupt signal line A in order to notify the motherboard 30 of the interrupt timing.

Numerous factors are conceivable for an interrupt. It is the FPGAs 42 that monitor whether an interrupt factor takes place. If even one interrupt factor takes place, an associated one of the FPGAs 42 reads the value of the interrupt factor. The input/output driver 40D on the core board 40 is actuated, and the motherboard 30 is notified of the interrupt timing over the signal line A. Consequently, the interrupt flag in the FPGA is read directly into the input/output driver 30D. An application is then initiated to run on the motherboard 30. Depending on which of interrupt flags are set, applications associated with the set flags are run successively. After the motherboard 30 is notified of the interrupt timing over the signal line A, the input/output driver 40D on the core board 40 comes to disable PCI interrupts.

(1-2) Input/output Data

Input/output data is acquired when being read primarily from the register in each of the FPGAs 42 into the motherboard 30 over the PCI bus 39. The input/output data is specified when being written directly from the motherboard 30 into the register of each of the FPGAs 42 over the PCI bus 39. In order to transfer a large amount of data, the burst mode is adopted for higher communication efficiency. Bit data whose transfer rate may not be high and which is received or transmitted through input, output and latch ports is transferred all together during preprocessing or post-processing performed by the input/output driver.

When an application is run, accessing the input/output driver 40D on the core board 40 so as to check a certain port and specifying an output are performed within the application. As indicated with several dashed lines in FIGS. 7A and 7B, data is read directly from the FPGAs 42 or written directly in the FPGAs 42.

When an application is terminated, the last processing is performed along the path B indicated with a dashed line in FIG. 5. The termination of interrupt handling is written in the register of an associated one of the FPGAs 42 on the core board 40. Thereafter, interrupt handling is initiated on the core board 40. The reception E of an application completion notification is transmitted to the input/output driver 40D as indicated with a bold line. Consequently, the input/output driver 40D on the core board 40 comes to enable issuance of a PCI interrupt request. With the start S of waiting for issuance of the PCI interrupt request, a state in which the interrupt flags are monitored all the time is established. If any interrupt factor is found, the input/output driver 40D on the core board 40 acts to notify the motherboard 30 of the interrupt timing over the line A. The next interrupt handling is then executed. This sequence is repeated thereafter.

When an application is run on the motherboard 30 employed in the present invention as mentioned above, the FPGAs 42 are directly accessed in order to transfer data to or from the motherboard 30. Compared with a method according to which after input information is collected and acquired on the core board 40, output requests are collected and transferred all together to the motherboard 30, a delay in directing the input/output driver is limited, that is, response efficiency is high.

Figure 8A:
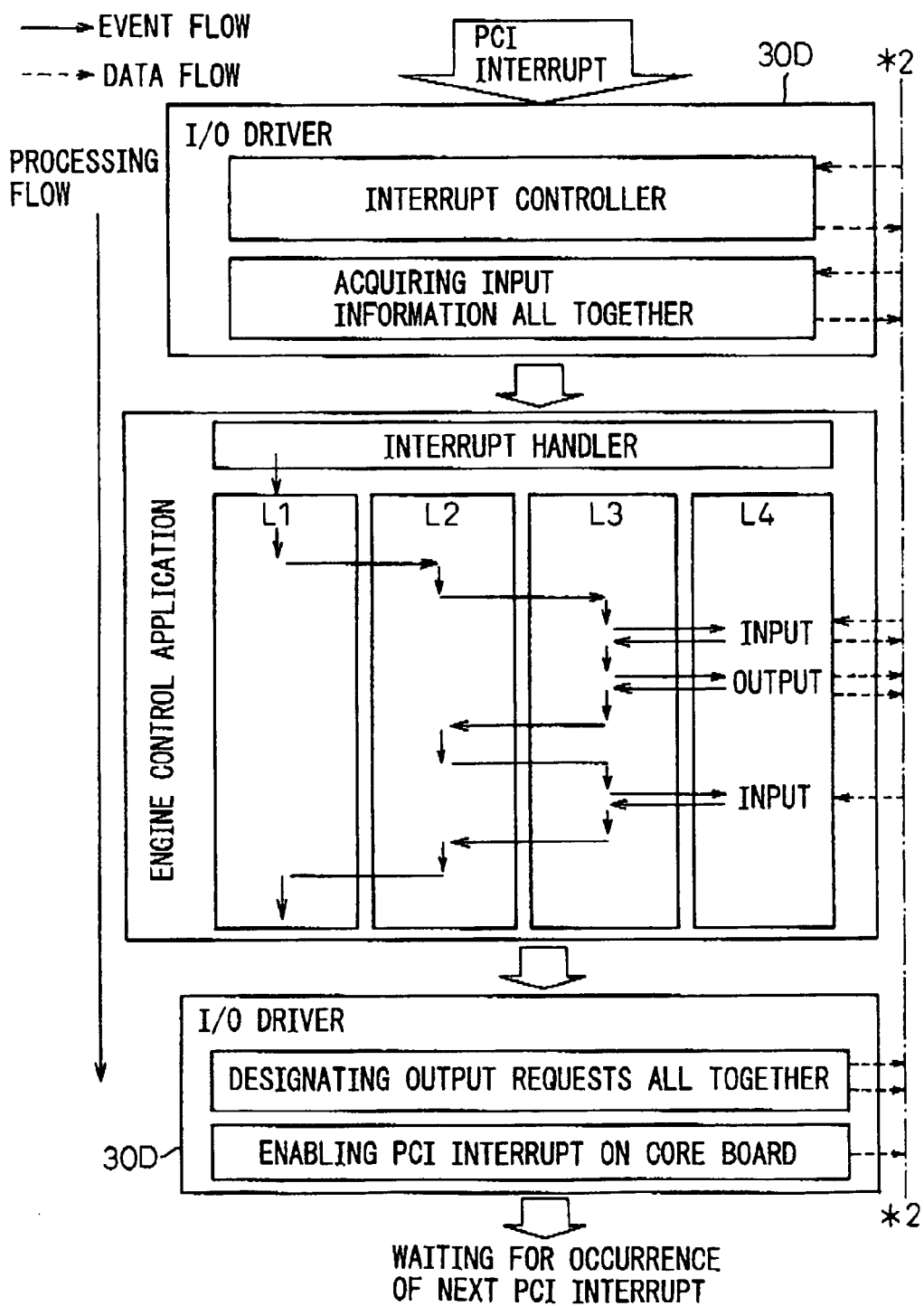
FIGS. 8A and 8B show software configuration so as to describe acquisition of input information on the motherboard shown in FIGS. 7A and 7B, actions of an application, and finalization of an output request.
Figure 8B:
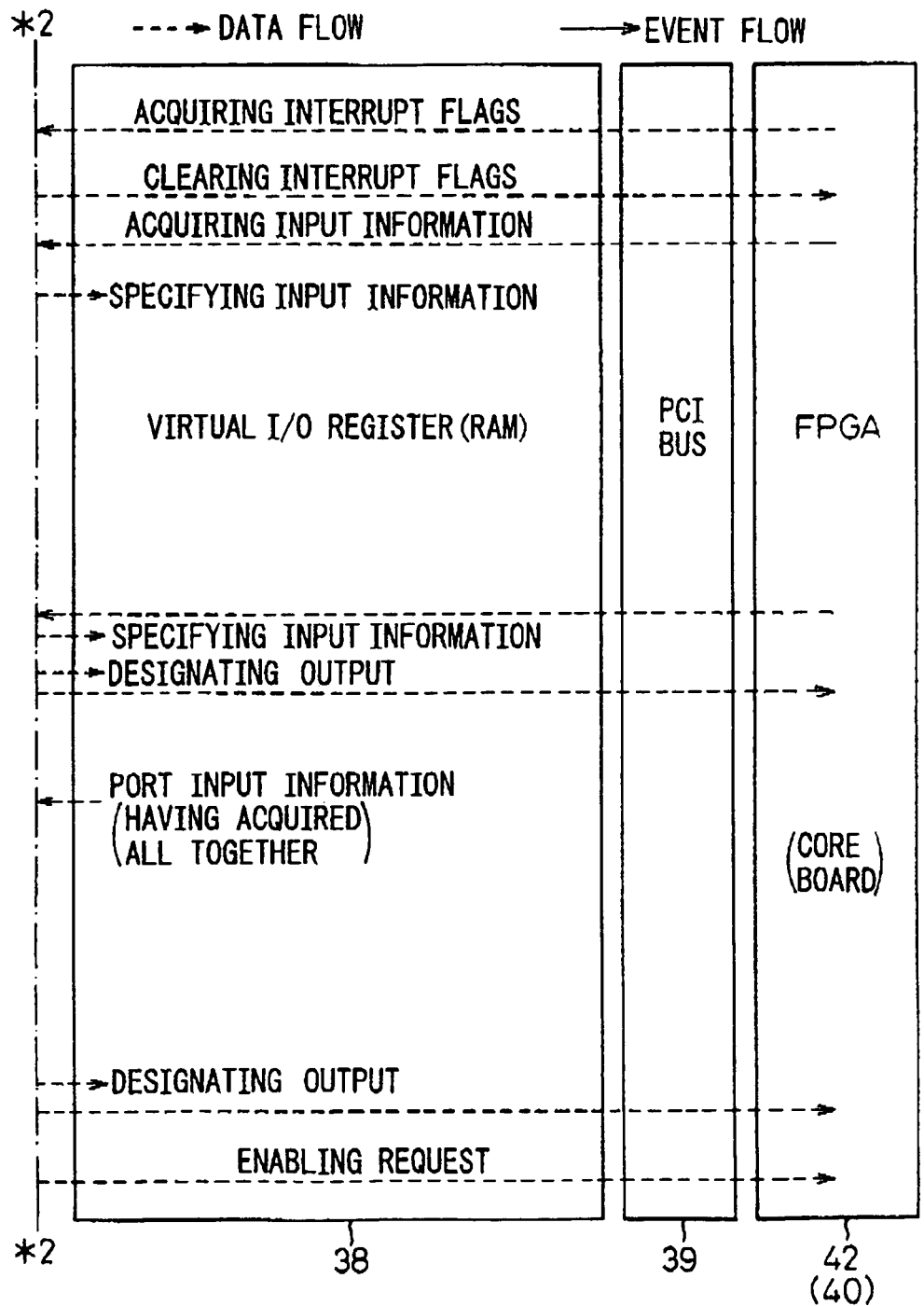

FIGS. 8A and 8B detail acquisition of input information, run of an application, and finalization of an output request which are executed on the motherboard 30 shown in FIG. 7A. A PCI interrupt request is transferred to the motherboard-side input/output driver 30D over the PCI bus 39 shown in FIG. 7A. The input/output driver 30D first acquires the interrupt flags from each of the FPGAs 42 and transmits them to the interrupt controller. After the interrupt flags are acquired, the interrupt flags are cleared and input information is acquired all together. This is because after input information is acquired, if interrupt flags are acquired, some input information may be modified with the acquisition of the interrupt flags. Consequently, according to the present invention, after interrupts are finalized, the latest information is read so that necessary values can be read reliably at optimal timings. In other words, after the interrupt controller finalizes interrupt factors, immediately before an interrupt handler is initiated, input information is acquired all together during preprocessing of the input/output driver. The input information to be acquired all together includes input data such as a port level, a captured value, received data, and an A/D-converted value.

Data to be acquired all together is data that may be acquired at a low speed and that can be divided into bits. This kind of data is acquired all together so that is can be acquired efficiently. After data is acquired all together, input information is specified in the virtual input/output register (RAM) 38. This is intended to transfer data from the motherboard 30 via the virtual input/output register 38 as if the motherboard 30 were connected to an actual microcomputer through the ports.

After interrupt flags are acquired and input information is acquired all together, the interrupt controller checks the interrupt flags and initiates applications associated with the interrupt flags. The applications are initiated within the interrupt handler.

An application comprises an application layer L1, two hardware-dependent layers L2 and L3, and a microcomputer-dependent layer L4. Necessary arithmetic/logic operations are executed on these layers. The arithmetic/logic operations include an input/output process. When an instruction that input information should be acquired is received, data is acquired directly from the FPGAs 42. Dash d lines drawn in FIGS. 8A and 8B between the microcomputer-dependent layer L4 and each of the FPGAs 42 and between the microcomputer-dependent layer L4 and the virtual register 38 correspond to dashed lines that approach or leave applications indicated in FIGS. 7A and 7B. Acquired data is temporarily stored in the virtual input/output register 38. If an output is designated, the designated output is written in the virtual input/output register 38 and transmitted to a concerned one of the FPGAs 42 so that an instruction will be issued actually.

In this case, if data designated as an output has already been written in the virtual input/output register 38 (port input information has been acquired all together in an early stage), the data is read from the virtual input/output register 38. Various cases are conceivable. Namely, data may be read directly from the FPGAs 2 or data designated as outputs may be read all together first. Moreover, FIGS. 8A and 8B show mere example of data transfer between the microcomputer-dependent layer L4 and the virtual input/output register 38 or each of the FPGAs 42. The data transfer may be performed any time. Moreover, the microcomputer-dependent layer L4 and each of the FPGAs 42 may have direct access to each other so as to acquire data. However, if access is gained too frequently, a load on the PCI bus 39 becomes large. Data that can be transferred all together is transferred all together, and the other data to be transferred is accessed directly in order to improve response efficiency. Thus, data is transferred appropriately according to the data. For example, data to be transferred to or from the FPGAs serving as an input port, an output port, and a latch port is handled all together, while the other data is directly transferred to or from the FPGAs 42.

When an application is terminated, the input/output driver 30D performs post-processing to designate output requests all together and to issue a PCI interrupt enabling request to the core board. When output requests are designated all together, outputs are specified in the virtual input/output register 38 and FPGAs 42. When a PCI interrupt enabling request is issued to the core board 40, the PCI interrupt enabling request is issued to the FPGAs 42. During the post-processing of the input/output driver 30D, output information such as an acquired port level, the result of comparison, a pulse-width-modulated signal, transmission data, communication initialization data, and A/D initialization data is transmitted to the core board 40 over the PCI bus 39. Thereafter, the input/output driver 30D waits for issuance of the next PCI interrupt request.

(2) Details of Processes Involving the Motherboard 30 and Core Board 40

The flow of data between the motherboard 30 and core board 40 caused by issuance of an interrupt request has been described comprehensively. Herein, processes involving the motherboard 30, PCI bus 39, and core board 40 shown in FIGS. 7A and 7B will be detailed. Namely, the processes indicated with ① to ⑤ in FIGS. 7A and 7B will be detailed. A power-on sequence indicated with ① will be described in section (2-1). Processing of a PCI interrupt signal indicated with ② will be described in section (2-2). A PCI access procedure indicated with ③ will be described in section (2-3). The action of the interrupt controller indicated with ④ will be described in section (2-4). Synchronization among a plurality of core boards indicated with ⑤ will be described in section (2-5).

(2-1) Power-on Sequence

Figure 9:
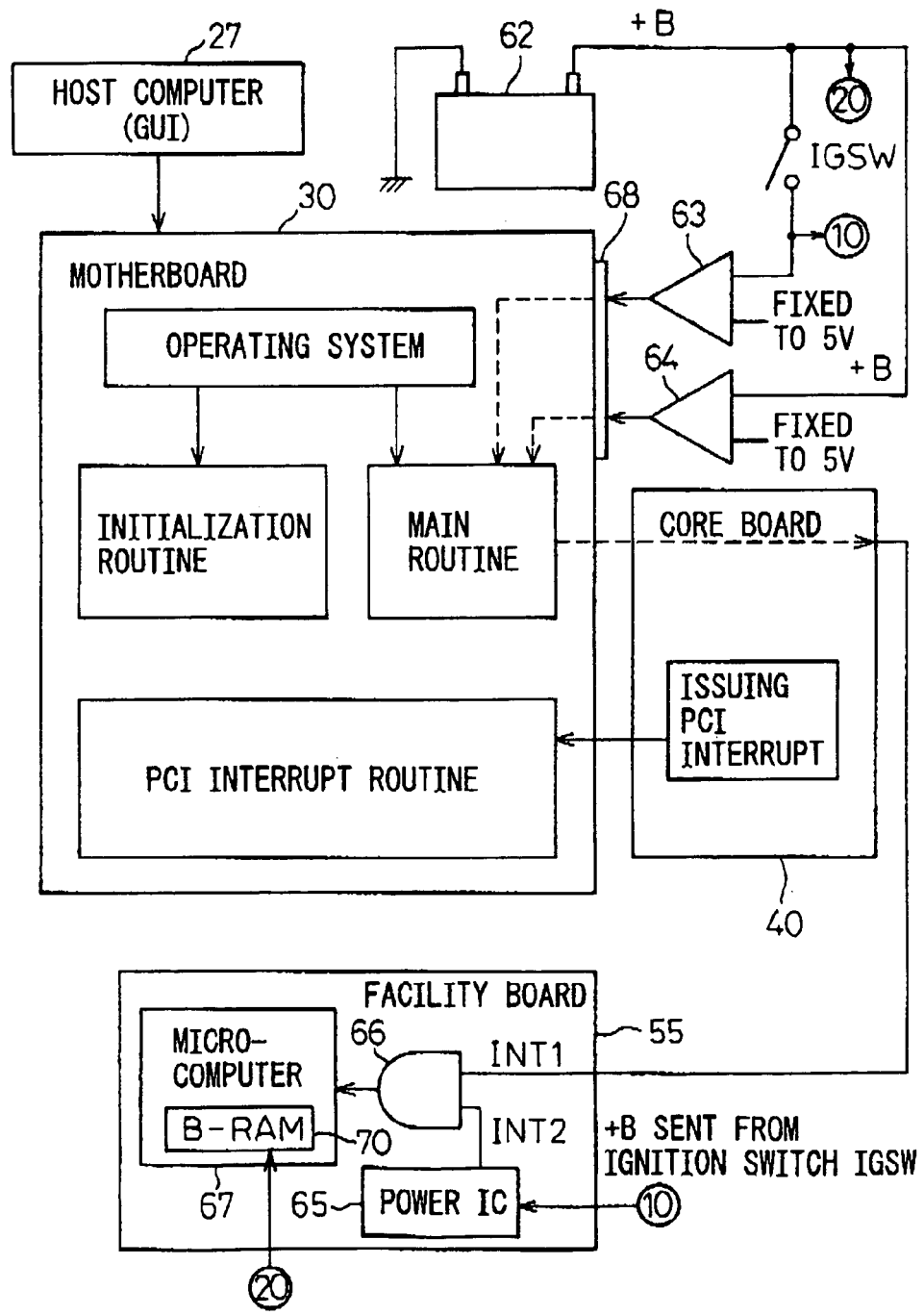
FIG. 9 is an explanatory diagram showing the configurations of the motherboard, the core board, and a facility board, and the peripheral circuits which are required to execute a power-on sequence denoted by ① in FIG. 7A.

A power-on sequence is a sequence of supplying power to the system in a case where an ignition switch IGSW is turned on after the power switch S1 of the logic development system 20 in accordance with the present invention included in an engine control system shown in FIG. 2 and the power switch S2 of the host computer 27 are turned on. For a better understanding of the power-on sequence, FIG. 9 shows the host computer 27, the motherboard 30 on which an operating system, an initialization routine, a main routine, and a PCI interrupt routine are installed, the core board 40 having a PCI interrupt issuing facility, the facility board 55 having a power IC 65, an AND circuit 66, and a microcomputer 67, a battery 62, the ignition switch IGSW, and comparators 63 and 64.

The initialization routine is initiated once every time data is transferred (downloaded) from the host computer 27. Moreover, the main routine is initiated regularly at intervals of 1 ms while the system is in operation. The PCI interrupt routine is initiated every time an interrupt request is issued while the system is in operation. The interrupt request is a request for initiating all software programs installed in the ECU 1 other than the power-on sequence. This routine causes all the main processes in the ECU 1 to start acting.

The power supply from which power is supplied during the power-on sequence is a battery 62 similar to the one included in an actual engine control system. An output voltage +B (=12 V) of the battery 62 is divided into two components. One of the components is applied to the first input terminal of the comparator 63 via the ignition switch IGSW, and the other is applied to the first input terminal of the other comparator 64. The voltage applied to the first input terminal of the comparator 63 is also applied to the power IC 65 mounted on the facility board 55. A fixed voltage of +5 V lower than the output voltage +B of the battery 62 is applied to the second input terminals of the two comparators 63 and 64 respectively. The output terminals of the comparators 63 and 64 are connected to a printer port 68 to which a direct input signal of the motherboard 30 is applied.

When the ignition switch IGSW is turned on, the output terminal of the comparator 63 is driven high. Unless the battery 62 is removed, the output terminal of the comparator 64 remains high. Within the main routine within which the outputs of the comparators 63 and 64 are received, when the output of the comparator 63 goes high, it is detected that the ignition switch IGSW has been turned on. When the output of the comparator 64 goes low, it is detected that the battery 62 has been removed.

For engine control, when the ignition switch IGSW is turned on, the operating system on the mother board 30 is initiated. When the ignition switch IGSW is turned off, the operating system is terminated. In an actual microcomputer, the reset state of the microcomputer is canceled with reception of a signal, and the microcomputer starts acting. Herein, whether the operating system is initiated or terminated is interlocked with the on or off state of the ignition switch IGSW.

The microcomputer 67 is mounted on the facility board 55. Even when the ignition switch IGSW is turned on, the microcomputer 67 is not actuated synchronously with the on state of the ignition switch. A first initial signal INT1 sent from the motherboard 30 is applied to the first input terminal of the AND circuit 66 on the facility board 55. A second initial signal INT2 sent from the power IC 65 is applied to the second input terminal. The voltage +B developed at the battery 62 is applied to the power IC 65 with the ignition switch IGSW on. The first initial signal INT1 is used to match the processing start timing on the facility board with that on the motherboard 30. The second initial signal is used to preserve a power-on reset time, which will be described later, after the ignition switch IGSW is turned on.

The actual microcomputer 67 has a backup RAM (B-RAM) 70 to which power is always supplied from the battery 62. Even if the ignition switch IGSW is turned off, data is preserved in the backup RAM 70. According to the present invention, the backup RAM may not be included, but the capability of the backup RAM is realized. Moreover, the power-on sequence includes a method of realizing the same capability as the capability of an EEPROM that holds data even after the battery is removed.

The power-on sequence will be described in conjunction with FIGS. 10A and 10B. FIGS. 10A and 10B describe steps involving the motherboard 30, core board 40, and facility board 55 that have the components shown in FIG. 9.

At step 1, an engineer turns off the power supplies of the logic development system 20 and host computer 27 included in the system whose configuration is shown in FIG. 2. When the engineer turns on the power supply of the system, the power supplies of the logic development system 20 and host computer 27 are turned on. However, the power supply of the facility board remains off. This state is attained when the power supplies of the logic development system 20 and of the main unit of the host computer 27 are turned on. At this time, the ignition switch IGSW is not turned on.

At step 2, the main routine shown in FIG. 9 and designed to check the power supply at intervals of 1 ms to see if the power supply is turned on is initiated with the power supply of the system turned on at step 1. Application software is downloaded from the host computer 27 to the motherboard 30, whereby the motherboard 30 included in the logic development system 20 is actuated. At this time, although the core board 40 is also actuated, PCI interrupts on the core board 40 are locked.

At step 3, initial values to which ports are set are determined within the initialization routine on the motherboard 30 shown in FIG. 9. The initialization is performed only once. The initialization includes (1) setting of the comparator to an immediate output mode, (2) setting of the pulse-width modulator (PWM) to a 0% output mode, (3) setting of the first initial signal INT1 to a low level, and (4) setting of the main routine to state 1.

At step 4, the first action (1) of state 1 is performed. With the first action (1) of state 1, a wait state is maintained until the ignition switch IGSW is turned on.

At step 5, the engineer turns on the ignition switch IGSW of a quasi vehicle. With the action (2) of state 1, it is detected whether the ignition switch IGSW is turned on. The power supply of the facility board 55 is then turned on. This state is equivalent to the one shown in FIG. 9 in which the ignition switch IGSW is turned on. The voltage +B developed at the battery 62 is applied to the comparator 63. With the high-level output of the comparator 63, the on state of the ignition switch IGSW is detected from the motherboard 30.

When the ignition switch IGSW is turned on, the voltage +B is applied to the power IC 65 on the facility board 55. Thereafter, with the action (3) of state 1, the main routine is set to state 2. A power-on reset time is predefined so that even if the power +B is supplied to the power IC 65, the second initial signal INT2 will not be driven high immediately. Therefore, even if the power +B is supplied to the power IC 65, the second initial signal INT2 remains low.

With the action (1) of state 2 performed at step 6, the contents of a memory are restored, that is, preserved files (in a memory incorporated in the host computer or a peripheral memory of the motherboard) are restored (read). Specifically, files preserved when the ignition switch IGSW is turned off previously are read out. At this time, if the battery has been removed, data is initialized. With the subsequent action (2) of state 2, data is read from an EEPROM (learned value data calculated by control software and optimized every time the driving of a vehicle is repeated). With the action (3) of state 2, the main routine is set to state 3. At step 6, the power IC on the facility board is still waiting for the power-on reset time, and the second initial signal INT2 remains low.

With the action (1) of state 3 performed at step 7, the power IC on the facility board waits for the elapse of the power-on reset time. With the action (2) of state 3 performed at step 8, the power IC on the facility board detects the elapse of the power-on reset time. With the elapse of the power-on reset time, the second initial signal INT2 sent from the power IC 65 on the facility board is driven high.

With the action (3) of state 3 performed at step 9, the first initial signal INT1 sent from the motherboard 30 to the facility board 55 via the core board 40 is driven high. This causes inputs applied to the two input terminals of the AND circuit 66 on the facility board 55 to go high. The output of the AND circuit 66 goes high. The reset state of the microcomputer 67 on the facility board 55 is canceled, and the microcomputer 67 is actuated. A program is started.

As mentioned above, the facility board 55 is not started immediately after the ignition switch IGSW is turned on but is started in a certain time thereafter. Namely, after the time having elapsed since the ignition switch IGSW is turned on becomes equal to the power-on reset time, the first initial signal INT1 is driven high on the motherboard 30 in order to actuate the facility board 55. Thus, the facility board 55 and motherboard 30 are synchronized with each other. Thereafter, with the action (4), the facilities realized on the facility board 55 other than the communication facility are initialized. With the action (5), the main routine is set to state 4.

With the action (1) of state 4 performed at step 10, the facility board 55 is initialized. While the facility board 55 is initialized, a standby state is maintained on the motherboard 30. In state 4, the microcomputer 67 on the facility board 55 acts to perform complex processing. The reset state of the microcomputer 67 on the facility board 55 is canceled, and the microcomputer 67 starts acting. Consequently, various kinds of initialization become necessary. In consideration of the time required for the various kinds of initialization, the standby state is maintained on the motherboard 30.

The complex processing (intelligent processing) to be performed on the facility board 55 is, for example, an output process (feedback) or control of a throttle angle (a current feedback is returned and compared with an angle command value, and the angle of a throttle valve is controlled so that it will agree with the command value). The facility board has a facility for controlling the angle of the throttle valve on a hardware basis according to a request value sent within an application. The facility board 55 is therefore initialized with the action (1) of state 4. With the action (2) performed at step 11, whether the internal processing of the facility board 55 is completed is judged by checking if the initialization time required for the facility board 55 has elapsed.

When the initialization time required for the facility board 55 has elapsed, communication of initialization data between the facility board 55 and motherboard 30 is started with the action (3). Consequently, communication is started according to the direct memory access (DMA) technique. Specifically, on the facility board 55, a reset state is canceled and a program is started for initialization. When the initialization is terminated, a normal processing mode is resumed. DMA communication is then started. A main process is downloaded onto the facility board 55. Herein, DMA communication is performed as a test. When a loop is entered in the normal processing mode, data is frequently transferred. Beforehand, communication is performed in order to check if communication can be achieved correctly. With the action (5), the main routine is set to state 5.

Referring to FIGS. 11A and 11B, with the action of state 5 performed at step 12, a wait state is established until the communication of initialization data between the motherboard 30 and facility board 55 is completed. The facility board 55 receives data. When the reception is terminated, transmission data is produced and transmitted at step 13. On receipt of the transmission data from the facility board 55, the motherboard 30 senses that the initialization of the facility board 55 is completed. Thereafter, the main routine is returned to state 6. Although the reception is not completed on the facility board 35, if a timeout occurs, the main routine is returned to state 4.

At step 14, the action of state 6 is performed. In state 6, with the action (1), completion of initialization of the facility board 55 is sensed. With the action (2) performed at step 15, a request for unlocking PCI interrupts is issued to the core board 40. After the request for unlocking PCI interrupts is issued to the core board 40, if an interrupt factor occurs on the core board 40, the request is accepted. Otherwise, the request is not accepted. When the power supply of the core board 40 is turned on first, PCI interrupts are locked. When the PCI interrupts are unlocked, interrupt flags are temporarily cleared in order to enable communication. Thereafter, with the action (3), the main routine is set to state 7.

The steps 1 to 15 constitute the power-on sequence. Steps 16 to 20 constitute a power-off sequence. The power-off sequence comprises the steps 16 to 20 at which the actions of state 7 and state 8 are performed. At the steps 16 to 18, PCI interrupt handling is repeated between the motherboard 30 and core board 40. Concurrently with the interrupt handling, with the action (1) of state 7, a standby stat is established until the ignition switch IGSW is turned off.

If it is detected with the action (2) of state 7 performed at step 17 that the ignition switch IGSW is turned off, the power supply of the facility board 55 is turned off. The main routine is set to state 8 with the action (3).

With the action (1) of state 8 performed at step 18, a request for locking PCI interrupts is issued to the core board 40. PCI interrupts are locked on the core board 40. With the action (2) of state 8 performed at step 19, the data in the memory on the motherboard 30 and the EEPROM is preserved, and the PCI interrupts are disabled on the core board.

With the action (3) of state 8 performed at the last step 20, the ports are set to initial values. This initialization is identical to the one performed at step 3. After the initialization is completed, the main routine is set to state 1, and the steps 3 to 19 are repeated.

(2-2) Handling PCI Interrupt Signals

FIGS. 12A and 12B detail handling of PCI interrupt signals (transferred over the signal line A as indicated in FIGS. 7A and 7B). The PCI interrupt signals are high-level signals as far as no event occurs. At this time, the microcomputer on the core board 40 keeps waiting for the occurrence of an interrupt. If any event occurs, the microcomputer on the core board 40 transmits a valid PCI interrupt output over the signal line A. This causes a PCI interrupt signal on the signal line A to go (active) low. Thereafter, the microcomputer on the core board 40 determines a PCI interrupt disabled period. Moreover, the active low signal on the PCI interrupt line A is record d as an on-state output in the PCI interrupt signal register included in each of the FPGAs 42.

The low-level PC interrupt signal is transmitted to the motherboard 30 over the signal line A. On receipt of the low-level PCI interrupt signal, the PCI interrupt request is accepted on the motherboard 30. On the motherboard 30, after the PCI interrupt request is accepted, PCI interrupt handling is executed. Within the first pass, an invalid PCI interrupt output is returned to the core board 40 over the PCI bus. This causes the PCI interrupt signal to go high. In other words, the interrupt signal is cleared. This is because when the PCI interrupt signal is held low over a long period of time, if PCI interrupt handling executed on the motherboard 30 is terminated quickly, the PCI interrupt request signal deriving from the same event may be accepted twice. Moreover, if the period during which the PCI interrupt signal is low is too short, the interrupt request is not accepted.

During the subsequent PCI interrupt handling, the input/output driver 30D runs an application. When the PCI interrupt handling executed on the motherboard 30 is completed, a fail-safe operation is performed on the motherboard 30 to see if the state of the PCI interrupt line A is high (inactive). This is because, if PCI interrupt handling is terminated with the PCI interrupt line A held low (active), an interrupt recurs. When the PCI interrupt handling executed on the motherboard 30 is completed, if the PCI interrupt line is inactive, the PCI interrupt handling is terminated. If the PCI interrupt line is active, after the PCI interrupt signal is cleared, the PCI interrupt handling is terminated.

(2-3) PCI Access Method

Figure 13B:
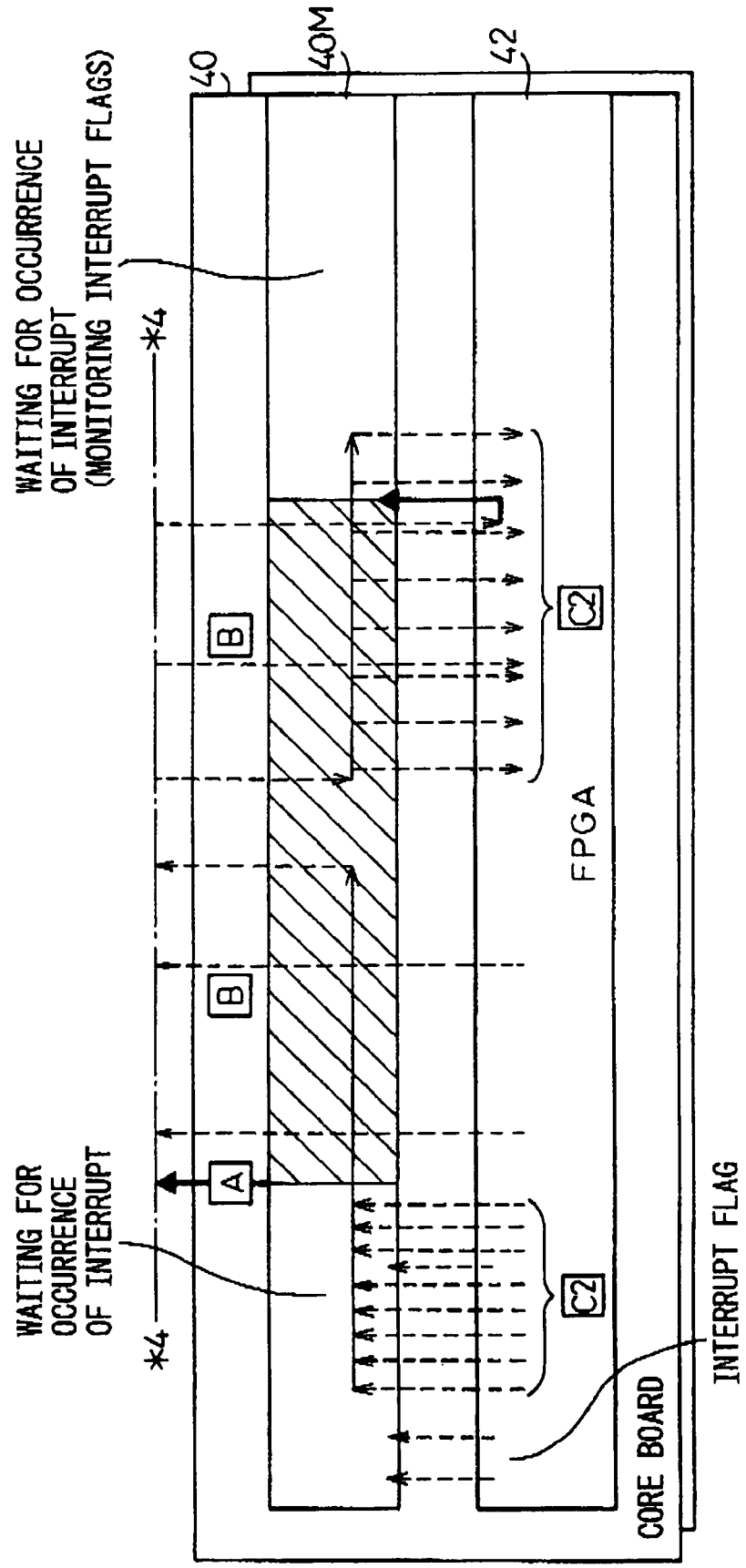

FIGS. 13A and 13B are explanatory diagrams concerning a PCI access method. In PCI access, primarily, the register included in each of the FPGAs 42 on the core board 40 is directly accessed from the motherboard 30 over the PCI bus 39 in order to read or write data, that is, to acquire or specify data. If a large amount of data is transferred between the motherboard 30 and core board 40 over the PCI bus 39, the burst mode is adopted. Data is transferred in units of a packet in order to improve communication efficiency. DMA communication or A/D conversion is performed in the burst mode.

In this case, data is temporarily fetched into the core board 40 along the path C described in conjunction with FIG. 5. The data is transferred via the input/output driver 40D on the core board 40. In other words, data is transmitted from each of the FPGAs 42 to the microcomputer 40M, and the microcomputer 40M transmits the large amount of received data to the motherboard 30 in the burst mode.

When the burst mode is adopted, a remote communicating side must support the burst mode. However, as the FPGAs 42 do not support the burst mode, the FPGAs 42 cannot be directly accessed in the burst mode. Therefore, as indicated in FIGS. 13A and 13B, a large amount of data is transmitted from the motherboard 30 to the microcomputer 40M on the core board 40 in the burst mode C1. Data is transmitted little by little from the microcomputer 40M on the core board 40 to each of the FPGAs 42 in a non-burst mode C2. Moreover, when data is sent from the core board 40 to the motherboard 30, data is fetched little by little from each of the FPGAs 42 into the microcomputer 40M on the core board 40 in the non-burst mode C2. When the fetching is completed, a reception interrupt flag is set. The motherboard 30 is notified of the interrupt timing over the signal line A. Thereafter, a large amount of data is sent from the microcomputer 40M on the core board 40 to the motherboard 30 in the burst mode C1 at predetermined timing.

(2-4) Actions of the Interrupt Controller

Figure 14:
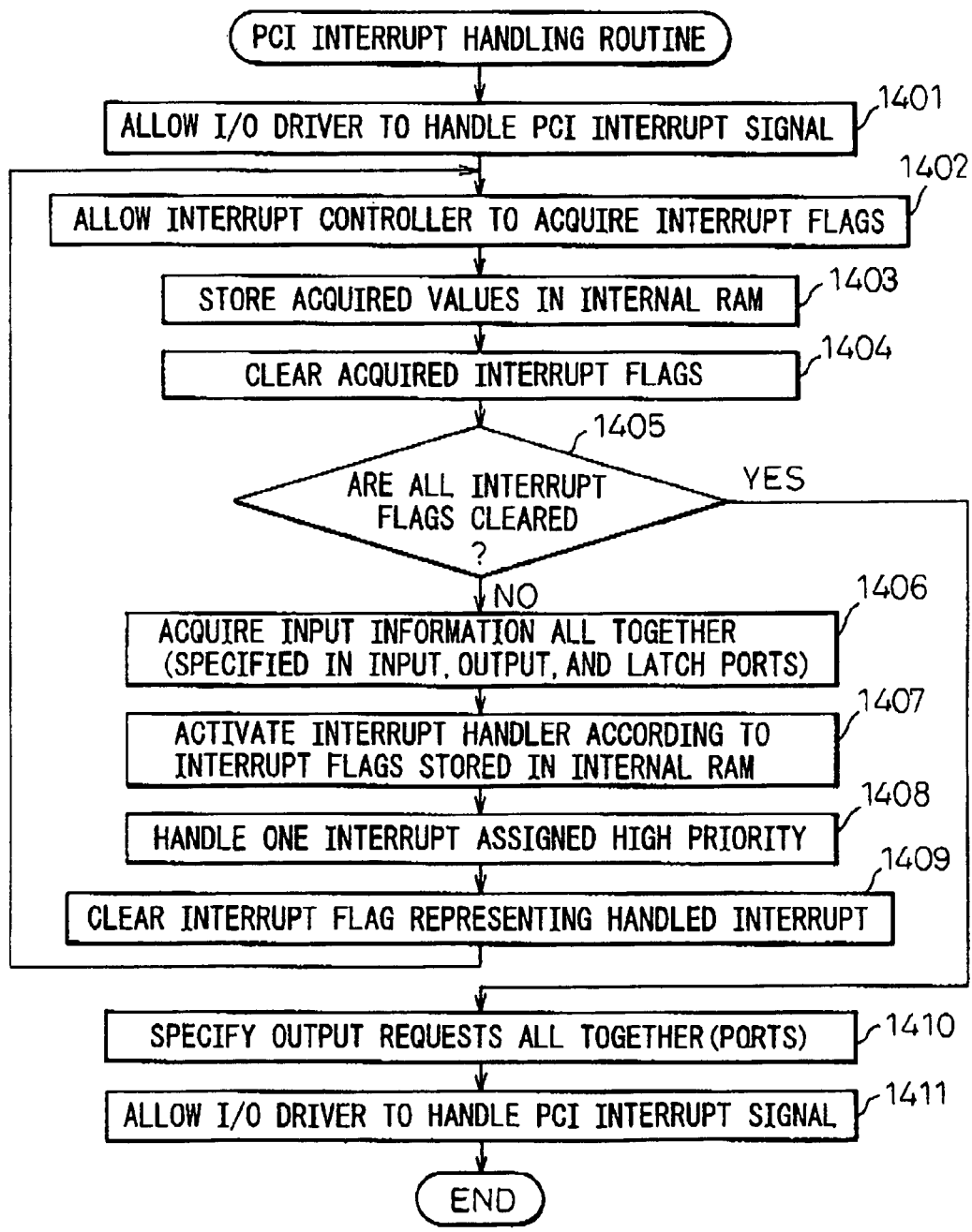
FIG. 14 is a flowchart describing the actions of an interrupt controller that include PCI interrupt handling.

FIG. 14 is a flowchart describing the actions of the interrupt controller that executes PCI interrupt handling. At step 1401, the input/output driver 30D on the motherboard 30 handles a PCI interrupt signal. At step 1402, the interrupt controller acquires interrupt flags. Thereafter, the values of the interrupt flags acquired by the interrupt controller are stored in the internal RAM at step 1403. At step 1404, the acquired interrupt flags alone are cleared.

If an interrupt flag set during manipulation of interrupt flags is acquired, interrupt handling is executed. The interrupt flag is then cleared. Moreover, if the interrupt flag cannot be acquired, interrupt handling is not executed and the interrupt flag is not cleared. Namely, when an interrupt flag is set, associated interrupt handling is executed only once. Thus, missing an interrupt flag is prevented.

By the way, manipulation of interrupt flags is such that: the interrupt flags are fetched from each of the FPGAs 42 into the motherboard 30; interrupt flags set to 1s are accepted on the motherboard 30; data items of the interrupt flags are written as clear requests in each of the FPGAs 42; and the interrupt flags corresponding to those accepted on the motherboard 30 (interrupt flags set to 1s) are cleared.

FIG. 15 shows the structure of a register included in an FPGA (if the FPGA serves as a capture unit). FIG. 15(*a*) shows the structure of an interrupt flag register in or from which data is written or read. As for reading, 1 signifies that an interrupt factor is present. 0 signifies that an interrupt factor is absent. The contents of a register in which an interrupt factor is recorded are read out. As for writing, when 1 is written, data is cleared. When 0 is written, data is preserved. In the present example, interrupt flags are acquired concurrently and stored in one register. The interrupt flags are therefore accessed efficiently.

FIG. 15(*b*) shows the structure of a register in which captured values are recorded. The descriptions of interrupts are recorded in the captured value register. In the present example, an interrupt flag is acquired in units of 32 bits. A register of 32 bits wide is adopted as the captured value register shown in FIG. 15(*b*). Moreover, the capture unit includes a free-run timer. A time instant when an interrupt (effective value) is received is recorded, and 1 is specified at the same time. The free-run timer is of a circulating type. In the present example, the structure of a register in which flags (0s or 1s) are recorded is different from the one of a register in which the descriptions of interrupts are recorded. A flag is a bit signal representing 0 or 1. Interrupt flags representing 1s are set are cleared. Thus, missing a flag that is set at delicate timing is prevented.

At the next step 1405, it is verified whether all interrupt flags are cleared. If all interrupt flags are cleared, control is passed to step 1410. Output requests are specified concurrently in the FPGAs serving as ports. At step 1411, the input/output driver handles a PCI interrupt signal. The routine is then terminated.

If it is verified at step 1405 that all the interrupt flags are not cleared, control is passed to step 1406. Input information is acquired all together (FPGAs serving as input, output, and latch ports). At step 1407, the interrupt handler is initiated according to the interrupt flags stored in the internal RAM. If a plurality of flags is stored in the internal RAM, interrupt handling is executed for one interrupt assigned the highest priority. For example, as far as the interrupt flag register shown in FIG. 15(*a*) is concerned, an interrupt factor is found on channels CH0 and CH3. In this case, either of interrupts assigned a higher priority is handled first. Thereafter, at step 1409, the interrupt flag representing an interrupt that has been handled is cleared. Control is then returned to step 1402.

At step 1402, the interrupt controller rereads interrupt flags. The reading is intended to check if an interrupt flag has been set to represent an interrupt assigned a high priority during manipulation of interrupt flags. Assuming that a new interrupt flag is read after a plurality of initially read interrupt flags is manipulated without being updated, an interrupt flag assigned a higher priority is not immediately reflected on the operation of the system. Consequently, a sampling period is shortened, and the time from the instant an interrupt flag is set to the instant reading is restarted is shortened.

Thereafter, as long as an interrupt flag that is not cleared is found, the processing from step 1402 to step 1409 is repeated. When all interrupt flags are cleared, control is passed from step 1405 to step 1410. When step 1410 and step 1411 are completed, the routine is terminated.

Figure 16:
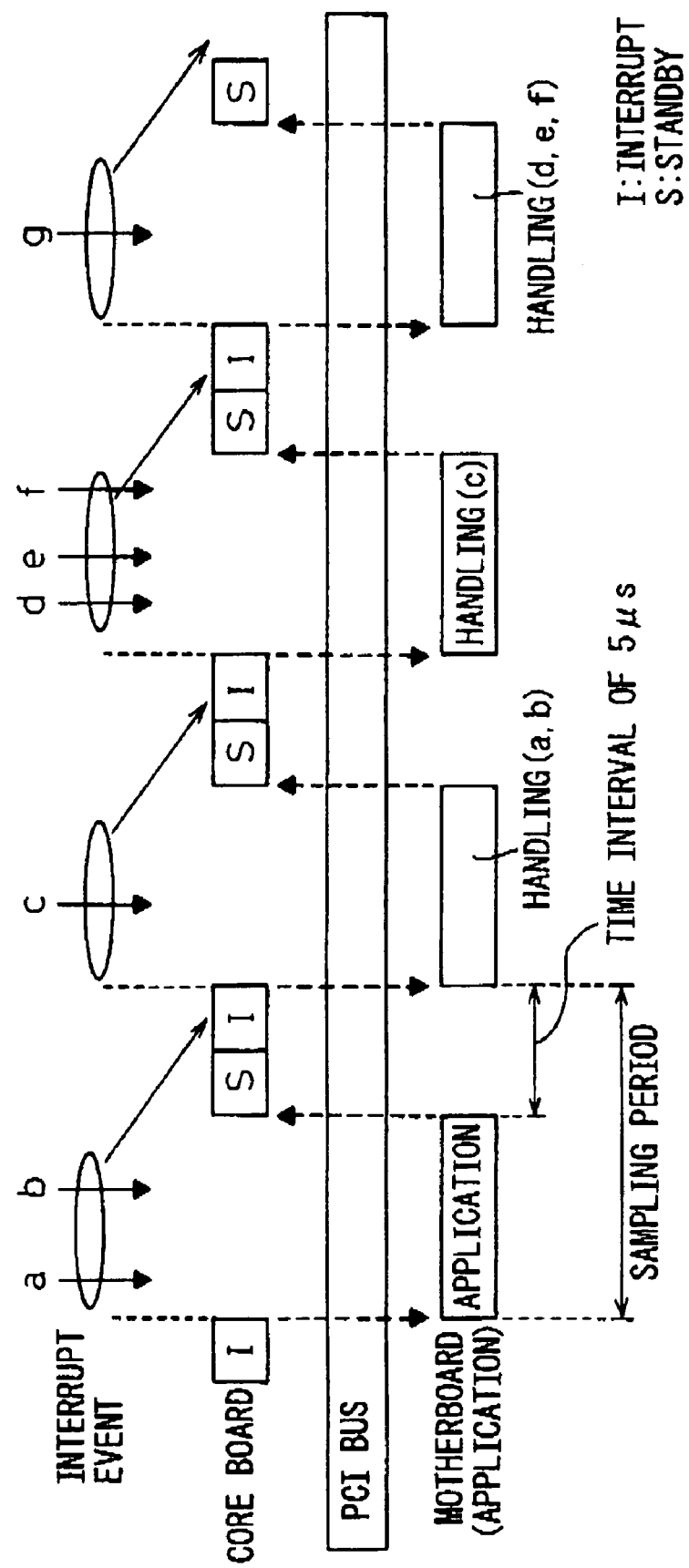
FIG. 16 is a timing chart concerning a process executed according to the present invention when an interrupt event occurs during a sampling period.

FIG. 16 is an explanatory diagram concerning processes executed according to the present invention in a case where any interrupt event occurs during a sampling period. Referring to FIG. 16, "interrupt" means an interrupt signal, "standby" means a standby state, and "handling" means interrupt handling. As illustrated, if interrupt events a and b occur during run of a first application, the interrupt events a and b are handled during the next sampling period. An interrupt event c occurring during handling of the interrupt events a and b is handled during the next sampling period. Likewise, the interrupt event c is handled during the next sampling period. Interrupt events d, e, and f occurring during handling of the interrupt event c are handled during the next sampling period.

Incidentally, interrupt flags are checked concurrently at certain timing. In this case, the number of interrupt flags to be checked may be one. If a plurality of interrupt flags is checked, the flag bits are acquired concurrently.

FIG. 17 is an explanatory diagram concerning processes to be executed according to the present invention in a case where the occurrence of an interrupt event is discontinued. Similarly to FIG. 16, "interrupt" signifies an interrupt signal, "standby" signifies a standby state, and "handling" signifies interrupt handling. As illustrated, if interrupt events a and b occur during run of a first application, the interrupt events a and b are handled during the next sampling period. Thereafter, if occurrence of an interrupt event is discontinued for some time, a standby state is established on the core board in order to wait for occurrence of an interrupt event. When an interrupt event c occurs, communication between the core board and motherboard is restarted. When the information of the interrupt event c is received, the interrupt event c is handled during the next sampling period.

(2-5) Synchronization of a Plurality of Core Boards

Figure 18B:
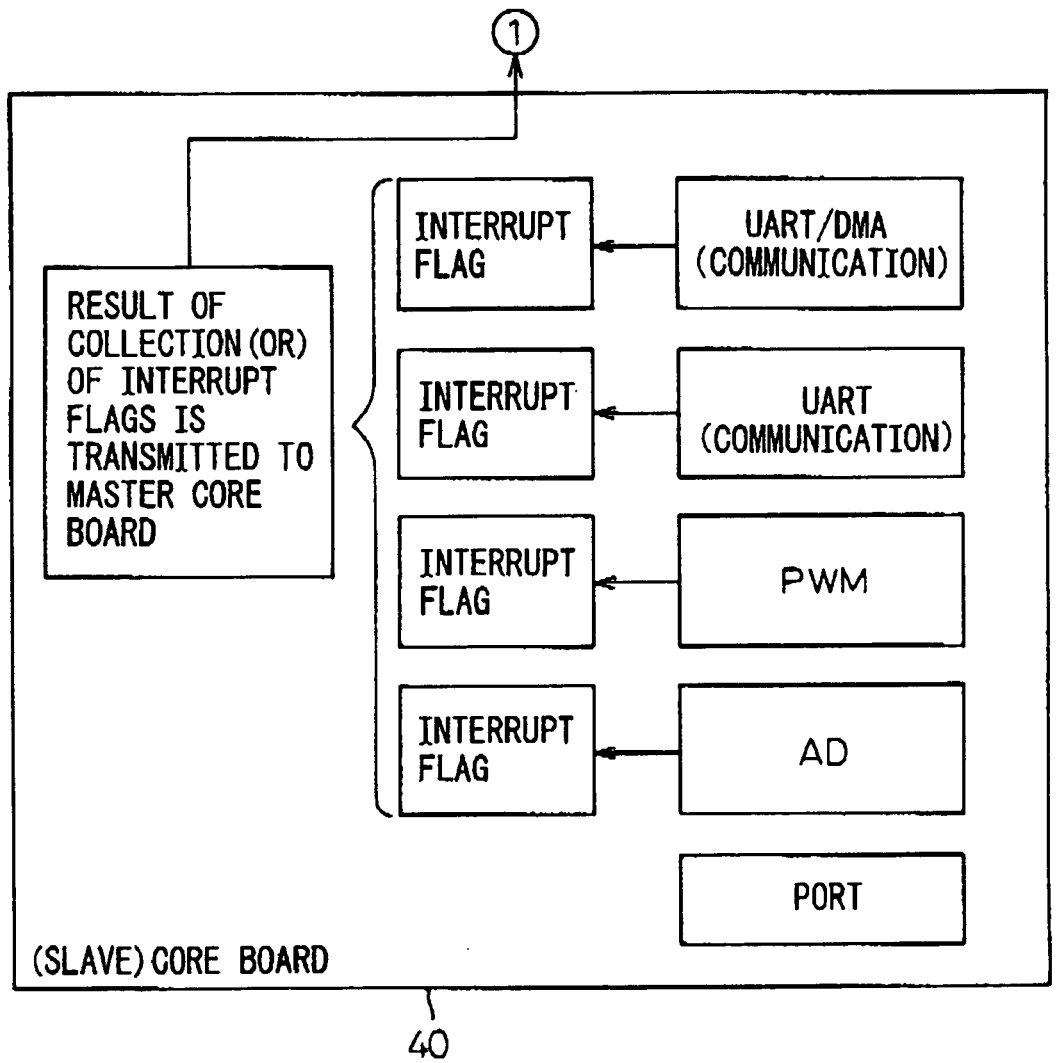

The number of FPGAs the core board 40 can accommodate is limited. Therefore, a plurality of core boards is employed in some cases. In such cases, the plurality of FPGAs is synchronized from the motherboard 30. Referring to FIGS. 18A and 18B, a description will be made of a case where two core boards 40 are employed. The first core board 40 shall be a core board for realizing a master and a timer, and the second core board 40 shall be a core board for realizing a slave.

The master/timer core board 40 accommodates various interrupting facilities such as a capture unit, a comparator, a pulse-width modulator (PWM), etc. The slave core board 40 accommodates communication-related interrupting facilities such as a universal asynchronous receiver/transmitter (UART)/direct memory access (DMA) device, a URAT, a PWM, and an A/D converter. The master/timer core board 40 has a free-run timer 69. The comparator and capture unit that operate with a timer value of the timer 69 as a reference must be synchronized with the free-run timer 69. In order to simplify synchronization with the timer, timer-related resources (free-run timer 69, comparator, and capture unit) are mounted all together on one core board 40. Resources independent of the free-run timer 69 (communication unit, PWM, A/D converter, and a port) are mounted on the slave core board 40.

For the present example, the orders according to which processes are executed will be indicated in parentheses.

(1) Interrupt flags are collected. The result of collection, that is, the OR of interrupt flags shall signify that any of the interrupt flags is set. If an interrupt flag is set, a PCI interrupt request is generated. Specifically, if an interrupt flag is set in any of the capture unit, comparator, and PWM on the master/timer core board 40 or any of the facilities on the slave core board 40, a PCI interrupt request is generated. The slave core board accommodates a universal asynchronous receiver/transmitter (UART)/a direct memory access (DMA) device, a UART, a PWM, and an A/D converter. If any of interrupt flags in the UART/DMA device, UART, PWM, or A/D converter on the slave core board is set, the set interrupt flags are collected and specified as an extension interrupt flag on the master/timer core board. More particularly, one flag representing the result of collection and indicating whether the interrupt flags are present on the slave core board is specified as the extension interrupt flag.

(2) A PCI interrupt signal is produced and transferred to the motherboard 30. With the PCI interrupt signal, PCI interrupts are disabled.

(3) PCI interrupt handling is executed on the motherboard 30. On the motherboard 30, it is impossible to execute PCI interrupt handling twice concurrently. PCI interrupts are therefore disabled on the core board 40 until the interrupt handling is completed on the motherboard 30.

(4) When the PCI interrupt handling is completed on the motherboard 30, a PCI interrupt completion signal is transmitted from the motherboard 30 to the core board 40. The PCI interrupt-disabled state is canceled.

(5) When the PCI interrupt-disabled state is canceled, the process (1) is restarted.

according to the foregoing procedure, a plurality of FPGAs is synchronized.

What is claimed is:

1. A logic development system using an external microcomputer which replaces a built-in microcomputer incorporated in an existing electronic control unit, comprising:
   a mother board including an application block and a first communication block;
   a core board including one or more devices which simulate, by software, peripheral devices of the built-in microcomputer so as to execute an input or output process, the core board further including a computing block and a second communication block;
   a peripheral component interconnect (PCI) bus coupling said mother board and said core board;
   an interface board including a port assignment conversion board, a plurality of standard circuits, and a plurality of facility boards which are associated with hardware of said electronic control unit, said standard circuits and facility boards being selectable by said port assignment conversion board, and said port assignment conversion board being coupled to said core board via a harness; and
   a bus controller in said computing block interposed between said first communication block in said mother board and each of said one or more devices,
   an internal memory in said computing block coupled to said bus controller over a first internal bus, wherein,
   said first communication block included in said mother board and said bus controller are coupled to each other over said PCI bus, and said bus controller and each of said one or more devices are coupled to each other over a second internal bus,
   said first communication block and each of said one or more devices transfer data to or from each other according to two transfer techniques,
   wherein a first one of the two transfer techniques transfers a first portion of the data by way of said PCI bus, bus controller, and the second internal bus without using said internal memory, the first one of the two transfer techniques being invoked for acquiring input information on the mother board during a first action of an application, and
   a second one of the two transfer techniques transfers a second portion of the data via said internal memory, wherein the second portion of the data from one of said one or more devices is stored in said internal memory via said first internal bus and said bus controller, and the second portion of the data stored in said internal memory is transmitted to said first communication block via said bus controller concurrently, wherein the second transfer technique is carried out before a second action of the application responsive to an interrupt request from the core board to the mother board.

2. A microcomputer logic development system according to claim 1, wherein: a virtual memory device, which is provided in a memory of said core board is interposed between said first communication block included in said mother board and said PCI bus; and when transfer data, which is transmitted over said PCI bus, is temporarily recorded in said virtual memory device in response to receiving or transmitting data, said virtual memory device behaves like a memory device included in the built-in microcomputer.

3. A microcomputer logic development system according to claim 1, wherein: an object on which said application block acts is a vehicle; said logic development system includes an ignition switch; and when said logic development system is interlocked with an on or off state of said ignition switch, control software for said vehicle is initiated or terminated in the same manner as control software residing in said electronic control unit which is also initiated or terminated in accordance with an on or off state of said ignition switch.

4. A microcomputer logic development system according to claim 3, wherein said plurality of facility boards includes at least one facility circuit in which a microcomputer is incorporated; and said facility circuit is not actuated with the on state of said ignition switch but is actuated synchronously with starting up of the mother board.

5. A microcomputer logic development system according to claim 4, wherein said facility circuit includes a power circuit that is actuated with the on state of said ignition switch, and a logic circuit which actuates the microcomputer in the facility circuit when both an initial signal sent from said power circuit and an initial signal sent from said mother board become valid.

6. A microcomputer logic development system according to claim 3, wherein initial values to ports are set within an initialization routine which is executed on said mother board and then the state proceeds to wait the on state of said ignition switch, after a power supply of said logic development system is turned on.

7. A microcomputer logic development system according to claim 1, wherein: said PCI bus contains a one-channel interrupt signal line over which an interrupt request is issued from said core board to said mother board; when said interrupt signal line is activated by said core board, said application block included in said mother board accepts the interrupt request; and after the interrupt request is accepted, said interrupt signal line is inactivated.

8. A microcomputer logic development system according to claim 7, wherein when interrupt handling is terminated, said application block included in said mother board checks if said interrupt signal line is inactive.

9. A microcomputer logic development system according to claim 8, wherein when interrupt handling is terminated, if said interrupt signal line is active, said application block included in said mother board inactivates said interrupt signal line.

10. A microcomputer logic development system according to claim 7, wherein after said application block included in said mother board accepts an interrupt request, said application block acquires interrupt flags from each of said one or more devices over said PCI bus; after said application block acquires interrupt flags, said application block clears the interrupt flags present in each of said one or more devices.

11. A microcomputer logic development system according to claim 10, wherein after said application block included in said mother board acquires interrupt flags, said application block executes a process associated with each of the acquired interrupt flags.

12. A microcomputer logic development system according to claim 10, wherein said interrupt flags are concurrently stored in one of one or more registers included in each of said one or more devices.

13. A microcomputer logic development system according to claim 12, wherein: a plurality of core boards are included; interrupt flags representing interrupts caused by each of a plurality of resources that are included in each of said core boards are stored in a register included in each of said core boards; the interrupt flags representing interrupts caused by each of the resources included in a first one of the plurality of core boards are stored in the register included in the first one of the plurality of core boards; and an extension interrupt flag indicating whether interrupt flags, representing interrupts caused by each of the resources included in each remaining ones of the plurality of core boards, are present is stored in association with each core board.

14. A microcomputer logic development system according to claim 13, wherein if said extension interrupt flag demonstrates that interrupt flags are stored in the register included in any of the remaining core boards, said application block acquires the interrupt flags from the register in the remaining core board.

15. A microcomputer logic development system according to claim 7, wherein: after said application block included in said mother board accepts an interrupt request, said application block acquires a plurality of interrupt flags from each of said one or more devices over said PCI bus; said application block selects one interrupt flag assigned a high priority, and executes a process associated with the interrupt flag; and after the process is completed, said application block clears a process completion interrupt flag present in each of said one or more devices.

16. A microcomputer logic development system according to claim 15, wherein after said application block selects one interrupt flag assigned a high priority, and executes a process associated with the interrupt flag, said application block re-acquires a plurality of interrupt flags from each of said one or more devices over said PCI bus.

17. A microcomputer logic development system according to claim 1, wherein: said computing block included in said core board includes a facility for temporarily fetching data; when a large amount of data is transferred between said mother board and each of said one or more devices included in said core board, the large amount of data is transferred in a burst mode between said mother board and said computing block, and transferred in a non-burst mode between said computing block and each of said one or more devices.

18. A microcomputer logic development system according to claim 1, wherein: a plurality of core boards are included; the first one of the plurality of core boards alone includes a free-run timer; said first one of the plurality of core boards includes at least resources that act synchronously with a timer value of said free-run timer; and remaining ones of the plurality of core boards include resources independent of said free-run timer.

19. A microcomputer logic development system according to claim 18, wherein: the resources that act synchronously with the timer value of said free-run timer include a comparator and a capture unit; and the resources independent of said free-run timer include a pulse-width modulator (PWM), a communication unit, an A/D converter, and ports.

20. The system of claim 1, wherein the one or more devices are field-programmable gate arrays, and under the first transfer technique, the first portion of the data is transferred directly between the mother board and the one or more field-programmable gate arrays via the PCI bus, bus controller, and internal bus without using said internal memory, and under the second transfer technique, the second portion of the data from the one or more field-programmable gate arrays is stored in the internal memory first before transfer of the second portion of the data to the mother board.

21. The system of claim 1, wherein the application is an automotive engine control software application.

22. A logic development method for a microcomputer including a mother board having an application block and a first communication block, a core board having one or more devices which simulate, by software, peripheral devices of the built-in microcomputer so as to execute an input or output process, the core board further including a computing block and a second communication block, an interface board having a port assignment conversion board, a plurality of standard circuits, and a plurality of facility boards which are associated with hardware of an electronic control unit, said standard circuits and facility boards being selectable by said port assignment conversion board, and said port assignment conversion board being coupled to said core board via a harness, a peripheral component interconnect (PCI) bus over which said mother board and said core board are coupled to each other, a bus controller in said computing block interposed between said first communication block in said mother board and each of said peripheral devices, an internal memory in said computing block coupled to said bus controller over a first internal bus, said microcomputer logic development method comprising:

issuing an interrupt request from said core board to said mother board over a one-channel interrupt signal line contained in said PCI bus;

accepting the interrupt request when said interrupt signal line is activated via said core board;

inactivating said interrupt signal line after the interrupt request is accepted;

transferring data between said first communication block and each of the peripheral devices according to two transfer techniques, wherein, a first one of the two transfer techniques transfers a first portion of the data by way of said PCI bus, bus controller, and the second internal bus without using said internal memory, the first one of the two transfer techniques being invoked for acquiring input information on the mother board during a first action of an application, and a second one of the two transfer techniques transfers a second portion of the data via said internal memory, wherein the second portion of the data from one of the peripheral devices is stored in said internal memory via said first internal bus and said bus controller, and the second portion of the data stored in said internal memory is transmitted to said first communication block via said bus controller concurrently, wherein the second transfer technique is carried out before a second action of the application responsive to the interrupt request from the core board to the mother board.

23. A microcomputer logic development method according to claim 22, further comprising the steps of:

after an interrupt request is accepted, acquiring interrupt flags from each of said one or more devices over said bus; and after the interrupt flags are acquired, clearing the interrupt flags from each of said one or more devices.

* * * * *